(12) United States Patent
Chatterjee et al.

(10) Patent No.: US 8,441,287 B2
(45) Date of Patent: May 14, 2013

(54) LOW VOLTAGE TRACK AND HOLD CIRCUITS

(75) Inventors: Shouri Chatterjee, New York, NY (US); Peter R. Kinget, Summit, NJ (US)

(73) Assignee: The Trustees of Columbia University in the City of New York, New York, NY (US)

( * ) Notice: Subject to any disclaimer, the term of this patent is extended or adjusted under 35 U.S.C. 154(b) by 179 days.

(21) Appl. No.: 11/663,373

(22) PCT Filed: Sep. 20, 2005

(86) PCT No.: PCT/US2005/033736
§ 371 (c)(1),
(2), (4) Date: Jun. 24, 2008

(87) PCT Pub. No.: WO2006/034311
PCT Pub. Date: Mar. 30, 2006

(65) Prior Publication Data
US 2009/0015329 A1 Jan. 15, 2009

Related U.S. Application Data

(60) Provisional application No. 60/611,601, filed on Sep. 20, 2004, provisional application No. 60/627,070, filed on Nov. 12, 2004, provisional application No. 60/704,466, filed on Aug. 1, 2005.

(51) Int. Cl.
*G11C 27/02* (2006.01)
*H03K 5/00* (2006.01)
*H03K 17/00* (2006.01)

(52) U.S. Cl.
USPC .......................................................... 327/94

(58) Field of Classification Search ............... 327/91–97; 341/122–125
See application file for complete search history.

(56) References Cited

U.S. PATENT DOCUMENTS

| | | | |
|---|---|---|---|
| 4,404,479 A * | 9/1983 | Toyomaki | 327/95 |
| 4,833,473 A | 5/1989 | Dingwall | |
| 5,408,235 A | 4/1995 | Doyle et al. | |
| 5,600,322 A | 2/1997 | Garavan et al. | |

(Continued)

FOREIGN PATENT DOCUMENTS

| | | |
|---|---|---|
| EP | 0757862 | 10/1998 |
| EP | 0910095 | 4/1999 |
| WO | WO 2004/049576 A2 | 6/2004 |
| WO | WO 2004/086408 A1 | 10/2004 |

OTHER PUBLICATIONS

International Patent Applicaiton No. PCT/US05/33736, filed Sep. 20, 2005.

(Continued)

*Primary Examiner* — Quan Tra
(74) *Attorney, Agent, or Firm* — Bryne Poh LLP

(57) ABSTRACT

Circuits that operate with power supplies of less than 1 Volt are presented. More particularly, circuits that operate with supply voltages near or lower than the threshold voltage of the transistors in those circuits are presented. Various circuits and embodiments such as operational transconductance amplifiers, biasing circuits, integrators, continuous-time sigma delta modulators, track-and-hold circuits, and others are presented. The techniques and circuits can be used in a wide range of applications and various transistors from metal-oxide-semiconductor to bipolar junction transistors may implement the techniques presented herein.

17 Claims, 18 Drawing Sheets

U.S. PATENT DOCUMENTS

| | | | | |
|---|---|---|---|---|
| 5,644,257 | A | * | 7/1997 | Kerth et al. ............... 327/96 |
| 5,808,513 | A | * | 9/1998 | Archer ..................... 330/253 |
| 5,920,211 | A | * | 7/1999 | Anderson et al. ........... 327/116 |
| 5,973,518 | A | | 10/1999 | Vallancourt |
| 6,020,769 | A | | 2/2000 | Vallancourt |
| 6,111,467 | A | | 8/2000 | Luo |
| 6,127,856 | A | | 10/2000 | Ueda et al. |
| 6,147,522 | A | * | 11/2000 | Rhode et al. ............... 327/93 |
| 6,147,541 | A | * | 11/2000 | Seesink .................. 327/337 |
| 6,169,427 | B1 | * | 1/2001 | Brandt ..................... 327/94 |
| 6,538,491 | B1 | | 3/2003 | Spanoche |
| 6,570,516 | B1 | | 5/2003 | Barker |
| 6,614,301 | B2 | | 9/2003 | Casper et al. |
| 6,617,921 | B2 | | 9/2003 | Forejt |
| 6,624,697 | B2 | | 9/2003 | Taylor |
| 6,624,698 | B2 | * | 9/2003 | Nagaraj .................. 330/258 |
| 6,771,194 | B2 | | 8/2004 | Shi |
| 6,862,438 | B2 | * | 3/2005 | Darabi ................... 455/226.3 |
| 6,888,407 | B2 | | 5/2005 | Ramazan et al. |
| 6,891,493 | B2 | | 5/2005 | Whittaker et al. |
| 6,909,308 | B2 | * | 6/2005 | Hunt ..................... 326/87 |
| 6,933,744 | B2 | | 8/2005 | Das et al. |
| 7,049,848 | B2 | | 5/2006 | Brooks et al. |
| 7,053,712 | B2 | | 5/2006 | Bonaccio et al. |
| 7,088,178 | B1 | | 8/2006 | Rosenfeld et al. |
| 7,164,291 | B2 | * | 1/2007 | Mair et al. ............... 326/83 |
| 7,372,392 | B1 | | 5/2008 | Wan et al. |
| 7,504,877 | B1 | | 3/2009 | Voogel et al. |
| 7,592,837 | B2 | | 9/2009 | Hoberman et al. |
| 7,609,756 | B2 | | 10/2009 | Wood |
| 7,768,242 | B2 | | 8/2010 | Wei et al. |
| 8,081,099 | B2 | | 12/2011 | Ikoma et al. |
| 2002/0093381 | A1 | | 7/2002 | Taylor |
| 2004/0108879 | A1 | | 6/2004 | Choi |
| 2004/0113669 | A1 | | 6/2004 | Wodnicki |

OTHER PUBLICATIONS

International Patent Application No. PCT/US05/33623, filed Sep. 20, 2005.

International Patent Application No. PCT/US05/33741, filed Sep. 20, 2005.

International Patent Application No. PCT/US05/33885, filed Sep. 20, 2005.

International Preliminary Report on Patentability in International Application No. PCT/US05/33623, filed Sep. 20, 2005, mailed Mar. 2, 2007.

International Preliminary Report on Patentability in International Application No. PCT/US05/33736, filed Sep. 20, 2005, mailed Sep. 2, 2008.

International Preliminary Report on Patentability in International Application No. PCT/US05/33741, filed Sep. 20, 2005, mailed Mar. 20, 2007.

International Preliminary Report on Patentability in International Application No. PCT/US05/33885, filed Sep. 20, 2005, mailed Mar. 20, 2007.

Office Action dated Jul. 19, 2010 in U.S. Appl. No. 11/663,373.

Office Action dated Nov. 19, 2010 in U.S. Appl. No. 11/663,376.

Office Action dated Nov. 15, 2011 in U.S. Appl. No. 11/663,378.

Ahn, G. et al., "A 0.6V 82dB sigma delta Audio ADC Using Switched-RC Integrators," Digest of Tech. Papers, IEEE Int. Conf. Solid-State Circuits, 2005, pp. 166-167, and 591.

Banu, M. et al., "An elliptic continuous-time CMOS filter with on-chip automatic tuning," IEEE J. Solid-State Circuits, vol. SC-20, No. 6, pp. 1114-1121, Dec. 1985.

Baschirotto, A. et al., "Low-Voltage Balanced Transconductor With High Input Common-Mode Rejection," Electronic Letters, vol. 30, No. 20, pp. 1669-1671, Sep. 1994.

Bazarjani, S. et al., "Low voltage SC circuit design with low-Vt MOSFETs," in Proceedings of IEEE International Symposium on Circuits and Systems (ISCAS), pp. 1021-1024, 1995.

Benabes, P. et al., "Synthesis and analysis of sigma-delta modulators employing continuous-time filters," Analog Integrated Circuits and Signal Processing, 23, 141-152, 2000.

Blalock, B. et al., "Designing 1-V op amps using standard digital CMOS technology," IEEE Transactions on Circuits and Systems—II: Analog and Digital Signal Processing, vol. 45, pp. 769-780, Jul. 1998.

Bult, K. "Analog design in deep sub-micron CMOS," in Proceedings European Solid-State Circuits Conference, pp. 11-17, Sep. 2000.

Chatterjee, S. et al., "A 0.5-V bulk-input fully differential operational transconductance amplifer," European Solid State Circuits Conference (ESSCIRC), pp. 147-150, Sep. 2004.

Chatterjee, S. et al., "A 0.5-V Filter with PLL-Based Tuning in 0.18um CMOS," in Digest of Technical Papers. ISSCC05, pp. 506-507, and 613, Feb. 2005.

Chatterjee, S. et al., "Weak Inversion of MOS Varactors for 0.5 V Analog Integrated Filters," Symposium on VLSI Circuits, Jun. 2005, pp. 272-275.

Chen, M.-J. et al., "Back-gate forward bias method for low-voltage CMOS digital circuits," IEEE Tran. Electron Devices, vol. 43, No. 6, pp. 904-910, Jun. 1996.

Cherry, J.A. et al., "Excess loop delay in continuous-time delta-sigma modulators," IEEE Trans. on Circuits and Systems II, vol. 46, No. 4, pp. 376-389, Apr. 1999.

Cho, T. et al., "A 10b, 20Msample/s, 35mW pipeline A/D converter," IEEE Journal of Solid-State Circuits, vol. 30, pp. 166-172, Mar. 1995.

Crols, J. et al., "Switched-opamp: an approach to realize full CMOS switched-capacitor circuits at very low power supply voltages," IEEE Journal of Solid State Circuits, vol. 29, pp. 936-942, Aug. 1994.

Dessouky, M. et al., "Very low-voltage digital-audio sigma delta modulator with 88-dB dynamic range using local switch boostrapping," IEEE Journal of Solid-State Circuits, vol. 36, No. 3, Mar. 2001, pp. 349-355.

Fattaruso, J. "Low-voltage analog CMOS circuit techniques," in International Symposium on VLSI Technology, Systems, and Applications, pp. 286-289, Jun. 1999.

Fernandes et al., "A 14-bit 10-us Subranging A/D Converter with S/H," IEEE Journal of Solid State Circuits, vol. 23, No. 6, Dec. 1988, pp. 1309-1315.

Ferri, G. et al., "A 1.3V op/amp in standard 0.7um CMOS with constant gm and rail-to-rail input and output stages," IEEE International Solid State Circuits Conference, pp. 382-383, 478, 1996.

Gerfers, F. et al., "A 1.5-V 12-bit power-efficient continuous-time third-order Sigma Delta modulator," IEEE J. Solid-State Circuits, vol. 38, No. 8, pp. 1343-1352, Aug. 2003.

Gerfers, F. et al., "A design strategy for low-voltage low-power continuous-time Sigma Delta A/D converters," Proc. Design, Automation and Test Conf., 2001, pp. 361-368.

Grech, I. et al., "A 0.9V wide-input-range bulk-input CMOS OTA for Gm-C filters," Proc. IEEE Int. Conf. Electronics, Circuits and Systems, 2003, pp. 818-821.

Grech, I. et al., "A V second order sigma-delta modulator," Analog Integrated Circuits and Signal Processing, 27, 147-159, 2001.

Guzinski, A. et al., "Body driven differential amplifier for application in continuous-time active-c filter," Proc. of ECCD, pp. 315-319, 1987.

Hogervorst, R. et al., "A compct power-efficient 3V CMOS rail-to-rail input/output operational amplifier for VLSI cell libraries," IEEE Journal of Solid-State Circuits, vol. 29, pp. 1505-1513, Dec. 1994.

Hosticka, B. et al., "Low-voltage CMOS analog circuits," IEEE Transactions on Circuits and Systems—I: Fundamental Theory and Applications, vol. 42, pp. 864-872, Nov. 1995.

Huang, H. et al., "Design and Application of CMOS bulk input scheme," IEEE J. Solid-State Circuits, vol. 39, pp. 1305-1312, Aug. 2004.

Huang, H. et al., "Design of Low-Voltage CMOS Continuous-Time Filter with On-Chip Automatic Tuning," IEEE Journal of Solid State Circuits, vol. 36, No. 8, pp. 1168-1177, Aug. 2001.

International Search Report and Written Opinion Issued for International Patent Application No. PCT/US05/033885.

International Search Report in PCT Application No. PCT/US05/33623.

International Search Report in PCT Application No. PCT/US05/033736.

International Search Report in PCT Application No. PCT/US05/033741.

Kaenel, V.R. et al., "Automatic adjustment of threshold and supply voltages for minimum power consumption in CMOS digital circuits," IEEE Symposium on Low Power Electronics, pp. 78-79. 1994.

Kao. J.T. et al., "A 175-mV multiply-accumulate unit using an adaptive supply voltage and body bias architecture," IEEE Journal of Solid-State Circuits, vol. 37, No. 11, pp. 1545-1554, Nov. 2002.

Karthikeyan, S. et al., "Low-voltage analog circuit design based on biased inverting opamp configuration," IEEE Transactions on Circuits and Systems—II: Analog and Digital Signal Processing, vol. 47, pp. 176-184, Mar. 2000.

Keskin, M. et al., "A 1-V 10-MHz clock-rate 13-bit CMOS sigma delta modulator using uity-gain-reset opamps," Proc. 27th Eur. Solid-State Circuits Conf. (ESSCIRC), Sep. 2001, pp. 532-535.

Kinget, P. "Implications of mismatch on analog VLSI," in Analog VSLI integration of parallel signal processing systems, ch. 3, pp. 119-174. Ph.D. Thesis, K.U. Leuven (Belgium), May 1996.

Kinget, P. et al., "Impact of transistor mismatch on the speed-accuracy-power trade-off of analog CMOS circuits." in Proceedings of the IEEE Custom Integrated Circuits Conference (CICC), pp. 333-336, May 1996.

Kobayashi, T. et al., "Self-Adjusting Threshold-Voltage Scheme (SATS) for Low-Voltage High-Speed Operation," in IEEE Custom Integrated Circuits Conference, May 1994, pp. 271-274.

Lasanen, K. et al., "A 1-V 5 uW CMOS-opamp with bulk-driven input transistors," 43rd IEEE Midwest Symposium on Circuits and Systems, pp. 1038-1041, 2000.

Lehmann, T. et al., "1-v power supply CMOS casode amplifier," IEEE Journal of Solid-State Circuits, vol. 36, pp. 1082-1086, Jul. 2001.

Li, Q. et al., "A 1.2V, 33uW second-order sigma delta modulator with signal adaptive control architecture," Proc. IEEE 2nd CAS Workshop on Low Power/Low Voltage Mixed-Signal Circuits and Systems (DCAC), 2001, pp. 23-26.

Ma et al., "A 1V Second-Order Sigma Delta Modulator," Proceeding of the IEEE International Symposium on Circuits and Systems 1998, May 31, 1998, pp. I-348-I-351.

Matsuya, Y. et al., "1 V power supply, low-power consumption A/D conversion technique with swing-suppression noise shaping," IEEE J. Solid-State Circuits, vol. 29, No. 12, pp. 1524-1530, Dec. 1994.

Matsuya, Y. et al., "A 16-Bit Oversampling A-to-D Conversion Technology Using Triple-Integration Noise Shaping," IEEE Journal of Solid-State Circuits, vol. 22, pp. 921-929, Dec. 1987.

Moon, U. et al., "Switched-capacitor circuit techniques in submicron low-voltage CMOS," in IEEE International conference on VLSI and CAD (ICVE '99), pp. 349-358, 1999.

Narendra, S. et al., "Ultra-low voltage circuits and processot in 180nm to 90 nm technologies with a swapped-body biasing technique," IEEE International Solid State Circuits Conference, Feb. 2004.

Office Action dated Feb. 19, 2010 in U.S. Appl. No. 11/663,373.

Office Action dated Jun. 2, 2010 in U.S. Appl. No. 11/663,376.

Office Action dated Jun. 16, 2009 in U.S. Appl. No. 11/663,377.

Ohguro, T. et al., "An 0.18-um CMOS for mixed digital and analog applications with zero-volt-Vth epitaxial-channel MOSFETs," IEEE Transactions on electron devices, vol. 46, No. 7, pp. 1378-1383, 1999.

Peluso, V. et al., "A 900-mV low-power Sigma Delta A/D converter with 77-db dynamic range," IEEE J. Solid-State Circuits, vol. 33, No. 12, pp. 1867-1897, Dec. 1998.

Rezzi, F. et al., "A 3V 12-55 MHz BiCMOS Pseudo-differential continuous-time filter," IEEE Transactions on Circuits and Systems I, vol. 42, No. 11, pp. 896-903, Nov. 1995.

Sansen, W. et al., "Toward sub 1 V analog integrated circuits in submicron standard CMOS technologies," Design of Technical Papers IEEE International Solid-State Circuits Conference (ISSCC), pp. 186-187, Feb. 1998.

Steyaert, M. et al., "Custom analog low power design: the program of low voltage and mismatch," in Proceedings of the IEEE Custom Intergrated Circuits Conference (CICC), pp. 285-292, May 1997.

Stockstad, T. et al., "A 0.9-V 0.5-uA rail-to-rail CMOS operational amplifier," IEEE J. Solid-State Circuits, vol. 37, No. 3, pp. 286-292, 2002.

Tan, N. "A 1.2 V 0.8-mV SI delta-sigma A/D convertor in standard digital CMOS process," Proc. 21st Eur. Solid-State Circuits Conf. (ESSCIRC), Sep. 1995, pp. 150-153.

Tschanz. J.W. et al., "Adaptive body bias for reducing impacts of die-to-die and within-die parameter variations on microprocessor frequency and leakage," IEEE J. Solid-State Circuits, vol. 37, No. 11, pp. 1396-1402, Nov. 2002.

Tsividis, Y. et al., "Internally varying analog circuits minimize power dissipation," IEEE Circuits and Devices Magazine, vol. 19, No. 1, pp. 63-72, 2003.

Ueno, T. et al., "A 0.9V 1.5mW continuous-time sigma delta modulator for WCDMA," Digest of Tech. Papers, IEEE Int. Conf. Solid-State Circuits, 2004, pp. 78-79.

U.S. Appl. No. 11/663,376, filed Mar. 20, 2007.

U.S. Appl. No. 11/663,377, filed Mar. 5, 2008.

U.S. Appl. No. 11/663,378, filed Jul. 30, 2009.

U.S. Appl. No. 60/611,601 filed Sep. 20, 2004.

U.S. Appl. No. 60/627,070, filed Nov. 12, 2004.

U.S. Appl. No. 60/704,466, filed Aug. 1, 2005.

van der Zwan, E.J. et al., "A 0.2-mW CMOS sigma delta modulator for speech coding with 80dB dynamic range," IEEE J. Solid-State Circuits, vol. 31, pp. 1873-1880, Dec. 1996.

Vittoz. E. "Future of analog in the VLSI environment," Proceedings ISCAS, pp. 1372-1375, May 1990.

Vittoz E. "MOS transistors operated in the lateral bipolar mode and their application in CMOS technolgy," IEEE Journal of Solid-State Circuits, vol. 18, pp. 273-279, Jun. 1983.

Written Opinion in PCT Application No. PCT/US05/33623.

Written Opinion in PCT Application No. PCT/US05/33736.

Written Opinion in PCT Application No. PCT/US05/33741.

Yan, S. et al., "A continuous-time sigma delta modulator with 88-db dynamic range and 1.1MHz signal bandwidth," IEEE J. Solid-State Circuits, vol. 39. No. 1, pp. 75-86, Jan. 2004.

Yao, L. et al., "A 1V 88d8 20kHz sigma delta modulator in 99nm CMOS" Digest of Tech. Papers IEEE Int. Conf. Solid-State Circuits, 2004, pp. 80-81.

Notice of Allowance and Fee(s) Due mailed Mar. 22, 2012 in U.S. Appl. No. 11/663,378, filed Mar. 20, 2007.

Notice of Allowance and Fee(s) Due in U.S. Appl. No. 11/663,378, filed Mar. 20, 2007, rnailed Sep. 20, 2012.

U.S. Appl. No, 13/633,245, filed Oct. 2, 2012.

* cited by examiner

LOW VOLTAGE TRACK AND HOLD CIRCUITS

CROSS REFERENCE TO RELATED APPLICATIONS

This application is a U.S. National Phase Application under 35 U.S.C. §371 of International Patent Application No. PCT/US2005/033736, filed Sep. 20, 2005, which claims the benefit of the U.S. Provisional Patent Application Nos. 60/611,601, 60/627,070, and 60/704,466, respectively filed on Sep. 20, 2004, Nov. 12, 2004, and Aug. 1, 2005, which are hereby incorporated by reference herein in their entireties.

BACKGROUND OF THE INVENTION

The present invention relates to circuits that can operate at low supply voltages. More particularly, the present invention provides circuits that function with supply voltages near or lower than the threshold voltage of transistors used in the circuit.

For some time, a trend in semiconductor circuits has been to decrease the feature size of transistors and to place more transistors in the same size area of silicon. This trend of decreasing feature size promises to bring the features of transistors into the nano-scale range so that the intrinsic speed of the devices, and thus the signal processing capability, can keep increasing. With continually shrinking feature size, supply voltages for circuits have also experienced a downward trend in order to maintain reliability, to reduce power density, and to avoid thermal problems. This downward trend in power supply voltages is beneficial for digital circuits because it reduces power consumption quadratically. However, the threshold voltages at which transistors operate have not decreased proportionally to the supply voltages because the transistors' threshold voltages cannot be reduced as aggressively. This is the case because lower threshold values create static leakage (i.e., unwanted electron/hole flow when a device is off) that would result in unacceptable circuit operation. Therefore, it is desirable to provide analog circuits that can operate with supply voltages near or lower than the threshold voltage of the transistors in those circuits.

SUMMARY OF THE INVENTION

Various circuits that operate with power supplies of less than 1 Volt are presented. More particularly, circuits that operate with supply voltages near or lower than the threshold voltage of the transistors in those circuits are presented. These circuits include operational transconductance amplifiers, biasing circuits, integrators, continuous-time sigma delta modulators, track-and-hold circuits, and others. The techniques and circuits can be used in a wide range of applications, and various transistors from metal-oxide-semiconductor to bipolar junction transistors may be used to implement the techniques presented herein.

In accordance with certain embodiments of the present invention, track and hold circuits are provided. Features of these track and hold circuits include: an operational transconductance amplifier (OTA) having an input and an output, wherein the output is coupled to the output of the track and hold circuit; a capacitor that is coupled across the input and the output of the OTA; a first switch having an input and an output, wherein the output is coupled to the input of the OTA; a second switch having an input and an output, wherein the input is coupled to a supply voltage and the output is coupled to the input of the first switch; and a resistor having a first side and a second side, wherein the first side is coupled to the supply voltage and the second side is coupled to the input of the first switch.

In accordance with certain embodiments of the present invention, track and hold circuits are provided. Features of these track and hold circuits include: an OTA means for providing an operational transconductance amplifier (OTA) having an input and an output, wherein the output is coupled to the output of the track and hold circuit; a means for providing a capacitance that is coupled across the input and the output of the OTA means; a first switching means for switching having an input and an output, wherein the output is coupled to the input of the OTA means; a second switching means for switching having an input and an output, wherein the input is coupled to a supply voltage and the output is coupled to the input of the first switching means; and a means for providing a resistance having a first side and a second side, wherein the first side is coupled to the supply voltage and the second side is coupled to the input of the first switching means.

Other features of these embodiments of the present invention are provided below.

BRIEF DESCRIPTION OF THE DRAWINGS

The above and other advantages of the present invention will be apparent upon consideration of the following detailed description, taken in conjunction with accompanying drawings, in which like reference characters refer to like parts throughout, and in which.

DETAILED DESCRIPTION OF THE INVENTION

Figure 1:
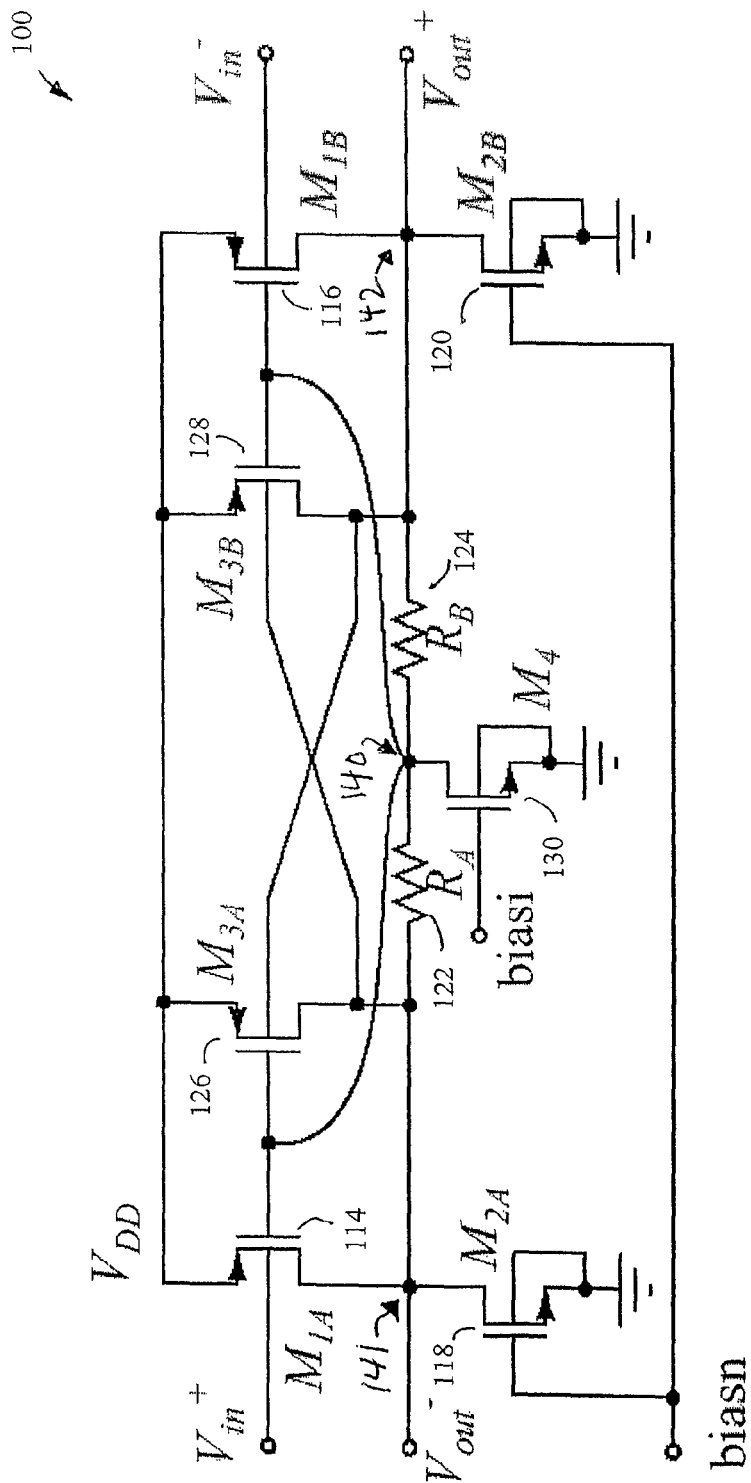
FIG. 1 is a schematic diagram of an Operational Transconductance Amplifier (OTA) with a bulk input in accordance with certain embodiments of the present invention.

The present invention relates to circuits that can operate at low supply voltages. More particularly, the present invention provides circuits that function near or lower than the threshold voltage of its transistors without relying upon internal voltage boosting. Low-voltage techniques which may be used in various combinations are automatic biasing to control gains and signal swings, the use of weakly inverted devices, the input of a signal at the body of a transistor, and the application of forward body bias to lower voltage thresholds. The transistors used in the composition of the various circuits presented herein may be fabricated with 0.18 μm process technologies down to nanometer process technologies. CMOS technology may be used. In accordance with the present invention, the circuits illustrated and described herein may be used as circuits of discrete components or integrated circuits as would be appreciated by one skilled in the art.

As the invention is described herein, reference is made to various forms of transistors. These transistors may include metal oxide semiconductor field effect transistor (MOSFET), such as PMOS and NMOS transistors, as well as any other suitable form of transistor. In certain applications within transistors, as will be apparent to one of ordinary skill in the art, these transistors may be used as switches. In such cases, the use of the term "input" in connection with such switching transistors in the specification and claims shall mean the terminal at which current flows into the transistor (e.g., the source in a PMOS transistor and the drain in an NMOS transistor), and the term "output" in connection with such switching transistors in the specification and claims shall mean the terminal at which current flows out of the transistor (e.g., the drain in a PMOS transistor and the source in an NMOS transistor).

Also, as the invention is described herein, reference is made to various resistors and capacitors. These resistors and capacitors may be implemented with transistor-based equivalents as known in the art when appropriate.

Generally speaking, the voltage threshold of a transistor is the voltage required to switch the transistor from a blocking state to a conducting state, and the voltage threshold typically varies from a couple of hundred millivolts to a volt in standard enhancement devices (e.g., transistors formed using standard CMOS processes). In a transistor, weak inversion, moderate inversion and strong inversion describe different characteristic states of transistor operation. Weak inversion is when a transistor is dominated by a diffusion current (i.e., a current caused by a free movement of electrons), moderate inversion is when a transistor has both a diffusion current and a drift current (i.e., a current caused by an electric field), and strong inversion is when a drift current dominates. For example, in a metal oxide semiconductor field effect transistor (MOSFET), weak inversion is when there is no channel in the device and the drain of the transistor is more reversed biased than the source.

In order to operate a transistor in moderate inversion (i.e., such that it is partially turned-on) when used in a half-volt circuit, the full supply voltage may have to be applied as a gate bias. However, an input signal to the transistor in this case will typically not be able to swing higher than this gate bias because it is at the maximum supply voltage, and thus portions of the input signal may be lost.

To overcome this problem, in accordance with the present invention, an input signal may be applied to the body (or bulk) of a transistor. Applying the input signal at the body of the transistor may allow the input signal to swing while the gate of the transistor is being used to put it in weak-to-moderate inversion mode of operation. The body may also be forward biased to lower the transistor's threshold voltage.

As set forth below, various differential mode amplifiers are presented. A differential mode amplifier preferably responds only to the differential voltage between its two inputs, with a voltage that is common to the two inputs (i.e., has the same amplitude and phase) being cancelled out. This is common-mode rejection. This common signal voltage is referred to as a common-mode voltage. Common-mode rejection ratio (CMRR) is the ratio of the differential mode gain over the common mode gain—see, e.g., Gray, Hurst, Lewis & Meyer, Analysis and design of analog integrated circuits, and B. Razavi, Design of analog CMOS circuits, which are hereby incorporated by reference herein in their entireties. A fully differential amplifier which is characterized by having two inputs and two outputs may use a common-mode feedback (CMFB) loop to control the common-mode voltages at different nodes and to suppress the common-mode voltage components present at different stages of an amplifier.

FIG. 1 illustrates a schematic of a low-voltage differential gain stage in accordance with certain embodiments of the present invention. As shown, the two inputs $V_{in}^+$ and $V_{in}^-$ are at the body junctions of transistors $M_{1A}$ 114 and $M_{1B}$ 116 (which form a differential pair). Outputs $V_{out}^+$ and $V_{out}^-$ are taken from output terminals of transistors $M_{1A}$ 114 and $M_{1B}$ 116. The transconductances of the bodies ($g_{mb}$) of these devices provide the input transconductances. Transistors $M_{1A}$ 114 and $M_{1B}$ 116 are loaded by transistors $M_{2A}$ 118 and $M_{2B}$ 120 (which act as current sources and an active load), respectively.

Resistors $R_A$ 122 and $R_B$ 124 feed back a signal corresponding to the output common-mode voltage to the gates of transistors $M_{1A}$ 114, $M_{1B}$ 116, $M_{3A}$ 126, and $M_{3B}$ 128 in order to provide common-mode rejection. A level shift is maintained by transistor $M_4$ 130 pulling a current though resistors $R_A$ 122 and $R_B$ 124 so that a level shift is created between node 140 and the common-mode voltage at nodes 141 and 142. Transistor $M_4$ 130 and resistors $R_A$ 122 and $R_B$ 124 form a level shift bias circuit. This level shift allows the outputs, $V_{out}$, of the circuit to be biased at one level while node 140 is at a second bias voltage so that operation of the transistors $M_{1A}$ 114, $M_{1B}$ 116, $M_{3A}$ 126, and $M_{3B}$ 128 may be in moderate inversion. For example, with a MOSFET, a level shift between the output common-mode voltage at 0.25 Volts and the gate bias at 0.07 Volts allows the gate-to-source voltage, $V_{GS}$, to be set. The relationship between $V_{GS}$ and the threshold voltage is a determining factor of the inversion level in a MOSFET. Therefore, by pulling a current through $R_A$ 122 and $R_B$ 124 with transistor $M_4$ 130, the inversion level and operating characteristics of the circuit can be modified through a level shift.

As shown, the body inputs of transistors $M_{3A}$ 126 and $M_{3B}$ 128 are cross-coupled to the drains of these transistors in order to add a negative resistance to the output of the circuit (i.e., at $V_{out}^+$ and $V_{out}^-$) and thereby boost the differential DC gain. This cross coupling may decrease the common-mode gain as well. Transistors $M_{3A}$ 126 and $M_{3B}$ 128 form a cross-coupled pair.

The following two equations give the differential and common-mode DC gain for the circuit illustrated in FIG. 1, where $g_{mbN}$ is the body transconductance of transistor N, $g_{mN}$ is the gate transconductance of transistor N, and $g_{dsN}$ is the output conductance of transistor N.

$$A_{diff} = \frac{g_{mb1}}{g_{ds1} + g_{ds3} + g_{ds2} + 1/R - g_{mb3}}$$

$$A_{cm} = \frac{g_{mb1}}{g_{ds1} + g_{ds3} + g_{ds2} + g_{mb3} + g_{m1} + g_{m3}}$$

In certain embodiments, $M_{3A}$ 126 and $M_{3B}$ 128 may be sized so that $g_{mb3}$ cancels out approximately 60 percent of $g_{ds1}+g_{ds3}+g_{ds2}+1/R$, which may result in a differential gain boost of 8 dB. Furthermore, operation near the weak to moderate inversion boundary may provide a relatively large transconductance of the body ($g_{mb}$), which may be useful when inputting signals to the body of a transistor because of a consequent gain increase.

As shown, where an input common-mode is at $V_{DD}/2$ (i.e., $V_{in}+$ and $V_{in}-$ being equal to 0.25 Volts in common mode), a forward bias on, for example, the body-source junction ($V_{BS}$) of a MOSFET may be introduced. A larger forward bias voltage may lead to greater threshold voltage reduction, but the body (or bulk) leakage current may increase exponentially with the amount of forward bias and the temperature. This body leakage current can be limited by constraining the forward bias voltage $V_{BS}$ to about 0.4 Volts, and such a forward bias may effectively lower the voltage threshold and increase the inversion level from those typically associated with a transistor. The use of body bias may be accomplished without much risk of latch-up because the supply voltage limits the voltages in the circuit, which in certain embodiments is less than 1 Volt. For example, a supply voltage $V_{DD}$ of 0.5 Volts may not be enough to forward-bias parasitic pn junctions to a sufficient degree to allow latching to occur.

Figure 2A:
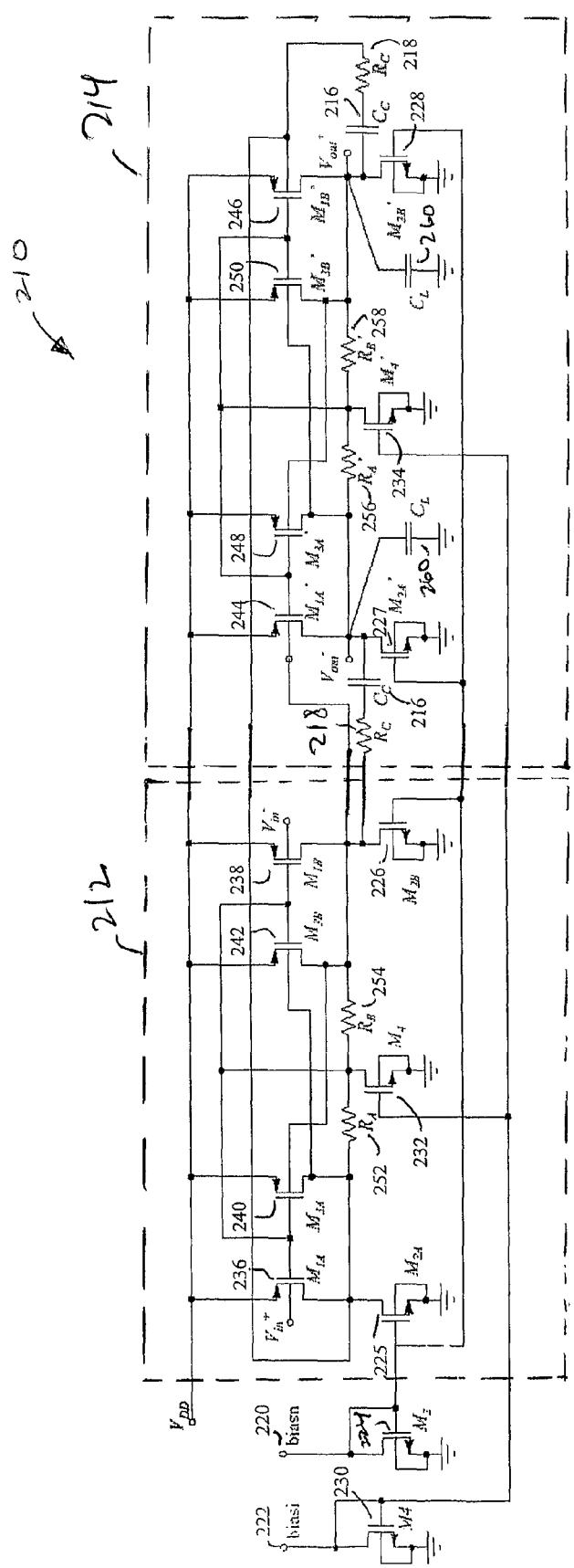
FIGS. 2A and 2B are schematic diagrams of a two-stage OTA in accordance with certain embodiments of the present invention.

FIG. 2 illustrates a two-stage differential operational transconductance amplifier (OTA) 210 in accordance with certain embodiments of the present invention. In other embodiments, more stages may be cascaded in a similar fashion to two-stage amplifier 210. Two-stage OTA 210 may be broken down into stage one 212 and stage two 214. As described herein and shown in the figures, stage two transistors and resistors are denoted with a prime symbol.

The circuits of stage one 212 and stage two 214 are similar to circuit 100 of FIG. 1. However, Miller compensation capacitors Cc 216 with series resistors Rc 218 are added for zero cancellation to stabilize the amplifier. Bias currents have also been applied at bias inputs biasn 220 and biasi 222 and are reflected throughout the OTA by current mirrors composed of transistors $M_2$ 224, $M_{2A}$ 226, $M_{2B}$' 228, $M_4$ 230, $M_4$ 232, and $M_4$' 234. For example, biasn may be 40 µA and biasi may be 4 µA.

The frequency response of OTA 210 may have a gain-bandwidth product approximately given by $g_{mb1}/(2\pi Cc)$, where $g_{mb1}$ is the body transconductance of the input transistors of the first stage, and may have a second pole given by $g'_{mb1}/(2\pi C_L)$, where $g'_{mb1}$ is the body transconductance of the input transistors of the second stage and $C_L$ 260 is a load capacitance.

As recited above, the transistors of OTA 210 operate in a similar fashion to the transistors described in connection with FIG. 1. As shown, transistors $M_{1A}$ 236 and $M_{1B}$ 238 and transistors $M_{1A}$' 244 and $M_{1B}$' 246 each form a differential pair which takes the input for the respective stage. Transistors $M_{3A}$ 240 and $M_{3B}$ 242 and transistors $M_{3A}$' 248 and $M_{3B}$' 250 form a cross-coupled pair. Level shifters as described herein may be formed from stage one 214 resistors $R_A$ 252 and $R_B$ 254 along with transistor $M_4$ 232, and stage two 214 resistors $R_A$' 256 and $R_B$' 258 along with transistor $M_4$' 234. Transistors $M_{2A}$ 225 and $M_{2B}$ 226 and transistors $M_{2A}$' 227 and $M_{2B}$' 228 form an active load for transistors $M_{3A}$ 240 and $M_{3B}$ 242 and transistors $M_{3A}$' 248 and $M_{3B}$' 250, respectively.

An example of some values for transistor sizes and other components for OTA 210 can be found below:

| Transistors | Width (µm) | Length (µm) |
|---|---|---|
| M1A, M1B | 240 | 0.5 |
| M2A, M2B | 75 | 0.5 |
| M3A, M3B | 40 | 0.5 |
| M4 | 3.5 | 1 |

| | Value |
|---|---|
| Resistors | |
| RA, RB | 100 kΩ |
| Rc | 6.5 kΩ |
| Capacitors | |
| Cc | 6 pF |

Figure 2B:
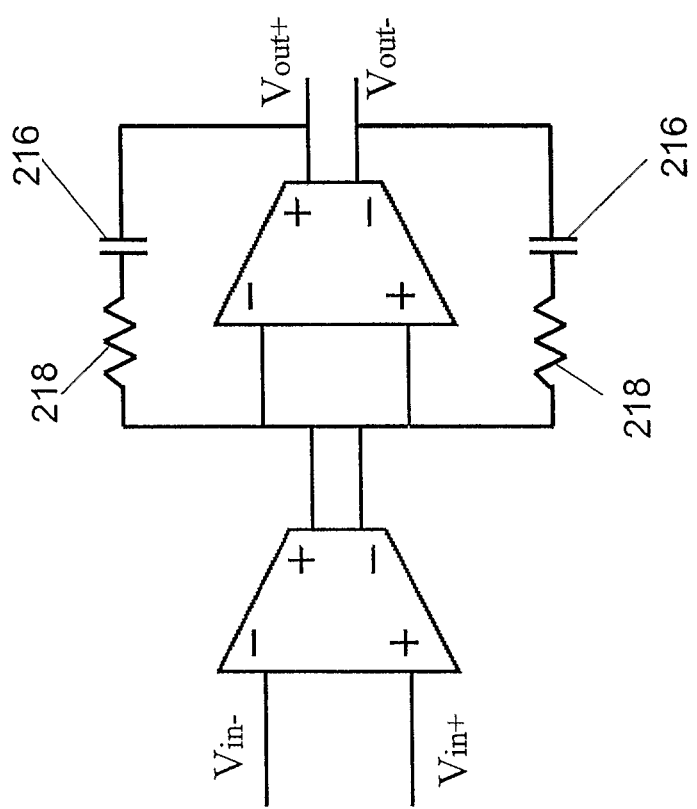

FIG. 2B illustrates a symbolic representation of the circuit described above in connection with FIG. 2A. Alternatively, the circuit described in connection with FIG. 2A can be represented more simply as shown in FIG. 1B.

Figure 3A:
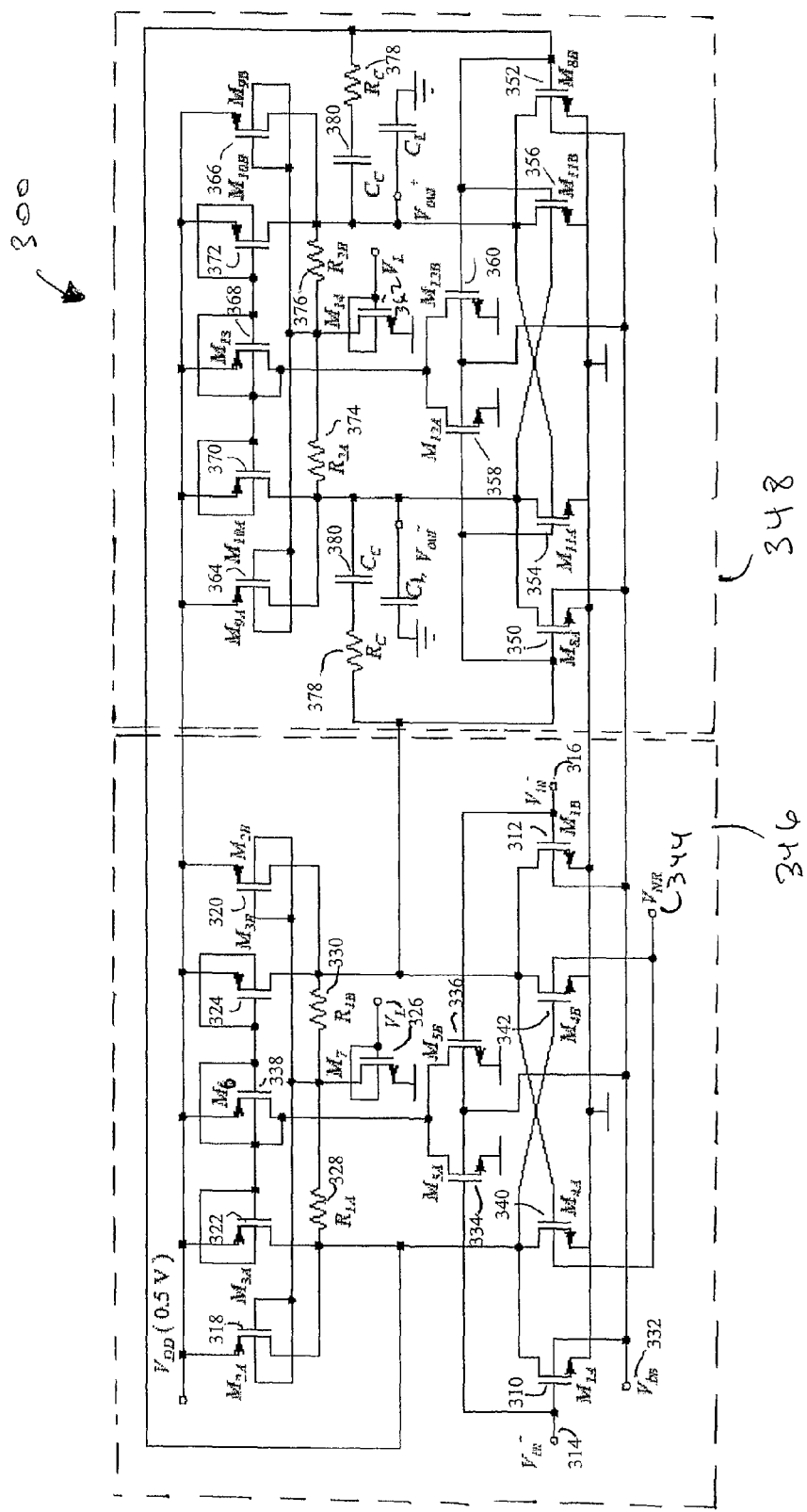
FIG. 3A is schematic diagram of another embodiment of a two-stage OTA with a gate input in accordance with certain embodiments of the present invention.

FIG. 3A illustrates another two-stage differential OTA 300 in accordance with certain embodiments of the present invention. OTA 300 consists of first stage circuit 346 cascaded with a similar second stage circuit 348 to obtain a greater DC gain. As may be appreciated by one skilled in the art, additional stages can be added as desired to change the gain as well as other characteristics of the circuit. A two-stage example was chosen to illustrate how additional stages may be added in accordance with certain embodiments of the invention.

In FIG. 3A, the DC output CM voltage may be set to 0.4 Volts at the drains of transistors $M_{1A}$ 310 and $M_{1B}$ 312, respectively, to bias second stage circuit 348. Likewise, the DC output CM of second stage circuit 348 may be set to 0.25 Volts to accommodate a maximum output signal swing between ground and the supply (where the supply is 0.5 Volts DC in this example).

Transistors $M_{1A}$ 310 and $M_{1B}$ 312 are a differential pair that amplifies differential inputs $V_{in}^+$ 314 and $V_{in}^-$ 316. Devices $M_{2A}$ 318, $M_{2B}$ 320, $M_{3A}$ 322, and $M_{3B}$ 324 (which may be PMOS devices) form an active load and are used to load transistors $M_{1A}$ 310 and $M_{1B}$ 312. The gates and bodies of devices $M_{2A}$ 318, $M_{2B}$ 320, $M_{3A}$ 322, and $M_{3B}$ 324 are coupled to add their body-source transconductances to the overall transconductance of the respective transistors, as well as to lower their voltage thresholds $V_T$.

Devices $M_{2A}$ 318, $M_{2B}$ 320, $M_{3A}$ 322, and $M_{3B}$ 324 may be DC biased at about 0.1 Volts to forward bias the transistor's junction and bring the transistors close to or in moderate inversion during operation. Transistor $M_7$ 326, which is coupled to transistors $M_{1A}$ 310 and $M_{1B}$ 312, may pull a level-shifting current through resistors $R_{1A}$ 328 and $R_{1B}$ 330. This level-shifting current allows the output voltage to swing into positive and negative values because the output common-mode voltage of the OTA can be set without compromising its inversion level. In this way, resistors $R_{1A}$ 328 and $R_{1B}$ 330 also set the output common-mode voltage at transistors $M_{2A}$ 318 and $M_{2B}$ 320. Transistors $M_{2A}$ 318 and $M_{2B}$ 320 may also provide local common-mode feedback.

In some embodiments, the bodies of transistors $M_{1A}$ 310 and $M_{1B}$ 312 are biased through the generation of a bias voltage $V_{bn}$ 332, which is discussed in further detail with reference to FIG. 4 below.

As also shown in FIG. 3A, a common-mode feed-forward (CMFF) cancellation path may be provided through $M_{5A}$ 334, $M_{5B}$ 336, $M_6$ 338, $M_{3A}$ 322, and $M_{3B}$ 324 to add an additional load to input transistors $M_{1A}$ 310 and $M_{1B}$ 312. The gates of $M_{5A}$ 334 and $M_{5B}$ 336 are coupled to the gates of transistors $M_{1A}$ 310 and $M_{1B}$ 312. As shown, the transistors of the CMFF cancellation path may receive a bias voltage, $V_{bn}$, at their body terminals to forward bias the transistors. Alternatively, the bodies of the transistors may be coupled to their gates.

As illustrated, a cross-coupled pair, $M_4$ 340 and $M_{4B}$ 342, may be used with the differential pair $M_{1A}$ 310 and $M_{1B}$ 312 to decrease the output conductance and increase its DC gain. The body voltage of the cross-coupled pair, $V_{NR}$ 344, sets the gain of the amplifier. The cross-coupled pair also provides a negative resistance load to the first stage of the amplifier. The amount of negative resistance may be controlled through the bodies of the cross-coupled pair by changing the voltage threshold of transistors $M_4$ 340 and $M_{4B}$ 342. The generation of $V_{NR}$ 344 is discussed in further detail with reference to FIG. 5B below.

As illustrated, second stage circuit 348 includes transistors $M_{8A}$ 350, $M_{8B}$ 352, $M_{11A}$ 354, $M_{11B}$ 356, $M_{12A}$ 358, $M_{12B}$ 360, $M_{14}$ 362 $M_{9A}$ 364, $M_{9B}$ 366, $M_{13}$ 368, $M_{10A}$ 370, and $M_{10B}$ 372, resistors $R_{2A}$ 374 and $R_{2B}$ 376. Transistors $M_{8A}$ 350 and $M_{8B}$ 352 form a differential pair, transistors $M_{11A}$ 354 and $M_{11B}$ 356 form a cross-coupled pair, transistors $M_{9A}$ 364 and $M_{9B}$ 366 act as an active load, transistors $M_{12A}$ 358, $M_{12B}$ 360, $M_{13}$ 368, $M_{10A}$ 370, and $M_{10B}$ 372 form a CMFF cancellation path, and transistor $M_{14}$ 362 and resistors $R_{2A}$ 374 and $R_{2B}$ 376 form a level shifting circuit. These transistors and resistors operate in a similar fashion to the corresponding transistors and resistors of first stage circuit 346 as described herein.

For a CM of 0.25 Volts DC, the gates of devices $M_{11A}$ 354 and $M_{11B}$ 356 are connected to the inputs of the stage. The bodies of devices $M_{11A}$ 354 and $M_{11B}$ 356 may be cross-coupled to boost the differential gain, and devices $M_{11A}$ 354 and $M_{11B}$ 356 may be sized conservatively so that devices $M_{11A}$ 354 and $M_{11B}$ 356 need not be tuned.

Operational Transconductance Amplifier (OTA) 300 may be stabilized with Miller capacitors Cc 378 and series resistors 380 across the second stage.

An example of some values for transistor sizes and other components for the circuit 300 of FIG. 3A can be found below:

| First Stage | | | Second stage | | |
| --- | --- | --- | --- | --- | --- |
| Transistors | W (μm) | L (μm) | Transistors | W (μm) | L (μm) |
| M1A, M1B | 72 | 0.36 | M8A, M8B | 100 | 0.36 |
| M2A, M2B | 270 | 0.36 | M9A, M9B | 240 | 0.36 |
| M3A, M3B | 270 | 0.36 | M10A, M10B | 240 | 0.36 |
| M4, M4B | 9 | 0.36 | M11A, M11B | 25 | 0.36 |
| M5A, M5B | 9 | 0.36 | M12A, M12B | 10 | 0.36 |
| M6 | 67.5 | 0.36 | M13 | 48 | 0.36 |
| M7 | 64 | 0.36 | M14 | 32 | 0.36 |
| Resistors and Capacitors | | | | | |
| R1A, R1B | 25 kΩ | | R2A, R2B | | 20 kΩ |
| | | | Rc | | 2 kΩ |
| | | | Cc | | 3 pF |

Figure 4:
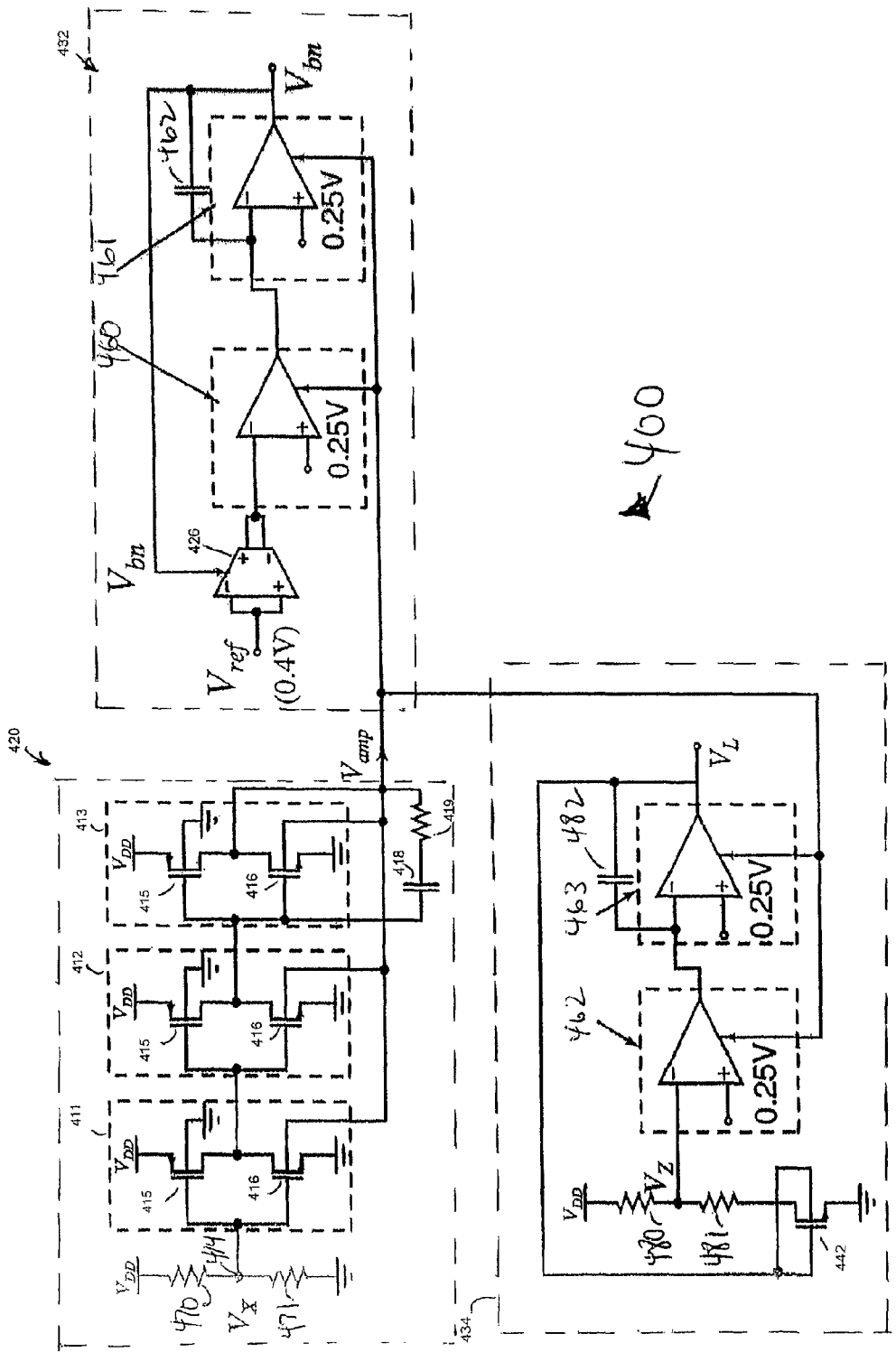
FIG. 4 is a schematic diagram of biasing circuitry in accordance with certain embodiments of the present invention.

FIG. 4 illustrates bias circuitry 400 for generating $V_{bn}$ and $V_L$. As shown, this circuitry is formed from portions 420, 432, and 434 that generate Vamp, $V_{bn}$, and $V_L$, respectively.

Turning to portion 420, which generates $V_{amp}$, it can be seen that this portion is made up of resistors 470 and 471, error amplifiers 411, 412, and 413, capacitor 418, and resistor 419. Resistors 470 and 471 form a voltage divider that is used to generate a voltage Vx at node 414. Error amplifiers 411, 412, and 413 are each formed from an inverter configuration of transistors 415 and 416 that amplifies the difference between its input voltage (e.g., Vx at node 414 for amplifier 411) and the switching threshold voltage of the inverter. In this way, a correction voltage is generated at the output of the inverter. The switching threshold of the inverter is the input voltage at which the inverter may swing from a high output to a low output, and vice-versa. The switching threshold can be set by sizing the transistors in the inverter, and can be modified by changing the voltage threshold of the transistors. In preferred embodiments, the switching threshold may be set to $V_{DD}/2$.

More particularly, error amplifiers 411, 412, and 413, capacitor 418, and resistor 419 work together as follows. If the switching threshold of error amplifier 411 increases above Vx, the output voltage of error amplifier 411 and input voltage of error amplifier 412 increases, which causes the output voltage of error amplifier 412 and the input of error amplifier 413 to decrease. This then causes the output of error amplifier 413 to increase. Because the body biases of transistors 416 are coupled to the output of error amplifier 413 (i.e., $V_{amp}$), as $V_{amp}$ increases, the switching threshold decreases. The switching threshold decreases because the voltage at the body of transistors 416 increases, which changes the voltage threshold of each transistor and subsequently its switching threshold. As shown, capacitor 418 and resistor 419 are coupled to the input and output of error amplifier 413 to create a feedback loop that stabilizes the error amplifier's switching threshold voltage. In this way, $V_{amp}$ generating circuit 420 allows the switching threshold to be set, using $V_{amp}$, independently of variations in process and temperature. $V_{amp}$ is provided to the error amplifiers 460, 461, 462, and 463 in portions 432 and 434 of circuitry 400 so that those error amplifiers will operate independently of process and temperature.

Although illustrated in FIG. 4 as being a single transistor, if desirable transistor 415 may be implemented using two transistors with their drains and sources connected in parallel as shown in FIG. 4, with the drain of one gate connected to node 414, with the other gate connected to $V_{amp}$, and with their bodies either floating or connected to ground.

Turning to portion 432 of circuitry 400, it can be seen that this portion is made up of OTA 426, error amplifiers 460 and 461, and capacitor 462. OTA 426 is preferably a replica of an OTA which circuitry 400 is being used to bias. As shown, the input to OTA 426 is a reference voltage of 0.4 Volts. Error amplifier 460 compares the output of OTA 426 to a reference voltage of 0.25 Volts. Error amplifier 461 similarly compares the output of error amplifier 460 to a reference voltage of 0.25 Volts. The output of error amplifier 461 (i.e., $V_{bn}$) is then coupled back to the bias input of OTA 426. Capacitor 462 is coupled between the inverting input and the output of error amplifier 461 to stabilize $V_{bn}$. In this way, a bias voltage (i.e., $V_{bn}$) is generated that causes the output of OTA 426 to equal 0.25 Volts. This bias voltage can then be used to control the operation of other OTAs independently of process and temperature. For example, using this bias voltage, the bodies of transistors $M_{1A}$ 310 and $M_{1B}$ 312 (FIG. 3A) may be placed in forward bias and their voltage thresholds lowered so that OTA 300 can function with a supply voltage of less than 1 Volt.

Turning to portion 434 of circuitry 400, it can be seen that this portion is made up of resistors 480 and 481, transistor 442, error amplifiers 462 and 463, and capacitor 482. As illustrated, resistors 480 and 481 and transistor 442 create a variable voltage $V_Z$ at the node between resistors 480 and 481 based upon the signal, $V_L$, generated at the gate and body of transistor 442. This variable voltage is then provided to the inverting input of error amplifier 462. Error amplifier 462 compares this voltage to a voltage reference of 0.25 Volts. Error amplifier 462 similarly compares the output of error amplifier 462 to a voltage reference of 0.25 Volts. The output of error amplifier 463 then drives the signal, $V_L$, provided to the gate and body of transistor 442. Capacitor 482 is coupled between the inverting input and output of error amplifier 463 to stabilize $V_L$. In this way, a control voltage (i.e., $V_L$) can be provided to establish when an IR (i.e., voltage) drop occurs and transfer the drop with an appropriate ratio to level shifters $M_7$ 326, $R_{1A}$ 328, $R_{1B}$ 330 and $M_{14}$ 358, $R_{2A}$ 360, $R_{2B}$ 362 (FIG. 3A) independently of process and temperature.

Referring back to FIG. 3A, it can be seen that body voltage $V_{NR}$ 344 at the bodies of transistors $M_4$ 340 and $M_{4B}$ 342 can be used to determine the amplifier gain. If the current drawn by transistors $M_4$ 340 or $M_{4B}$ 342 is too large, OTA 300 may develop a hysteresis (i.e., where changes in the input may not produce the expected change in the output until the change becomes large and there is a sudden jump in the output to the expected value). The hysteresis may cause OTA 300 to behave like a Schmitt-trigger.

FIG. 5 illustrates the DC transfer characteristics that may be realized with an operational transconductance amplifier 300 as illustrated in FIG. 3A. As shown, when the transconductance gain of transistor $M_4$ 340 or $M_{4B}$ 342, $g_{m4}$, increases, the gain lines may approach a slope of infinity, and split (i.e., gain lines with increasing values and decreasing values have different values along the x-axis for the same values on the y-axis). This hysteresis behavior of OTA 300 may be undesirable.

Figure 5B:
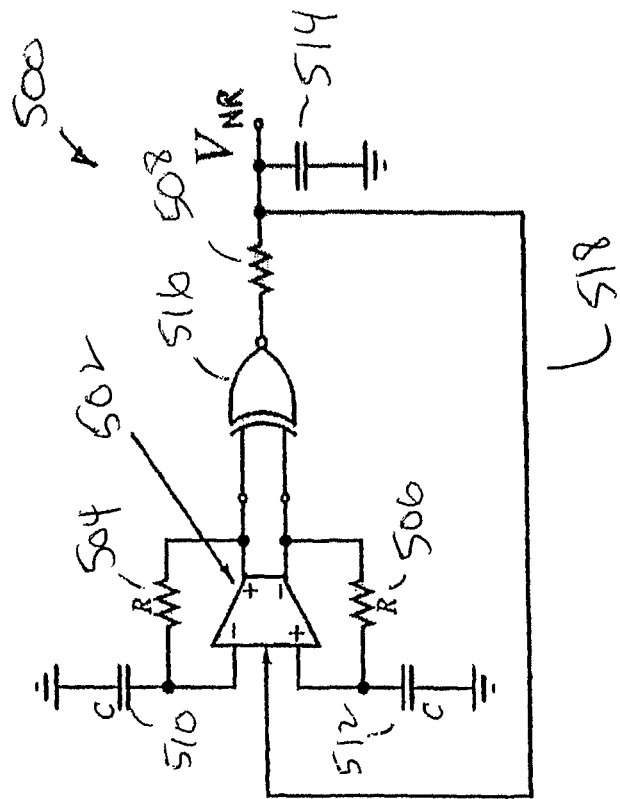
FIG. 5B is a schematic diagram of a Schmitt-trigger oscillator in accordance with certain embodiments of the present invention.
Figure 5A:
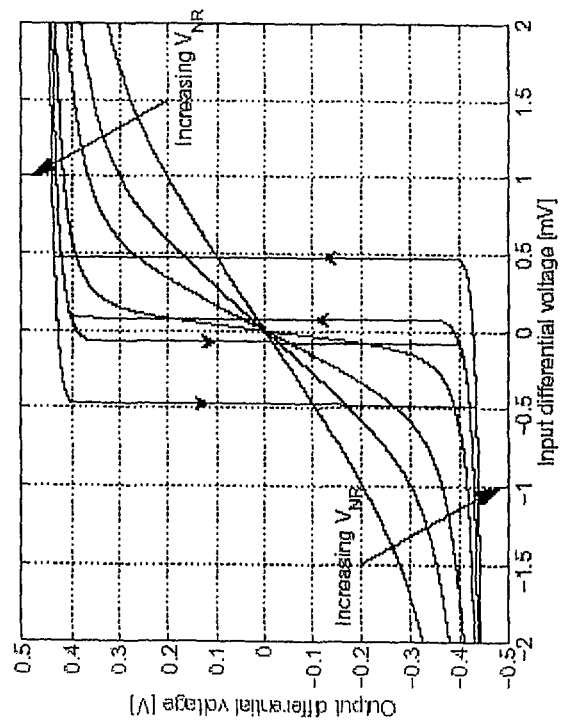
FIG. 5A is a graph of transfer characteristics of an operational transconductance amplifier in accordance with certain embodiments of the present invention.

In order to address this situation, a Schmitt-trigger oscillator (or bistable multi-vibrator) 500, as shown in FIG. 5B, may be used to control the transconductance of the cross-coupled pair of the OTA and prevent this hysteresis behavior. As illustrated, oscillator 500 includes a replica OTA 502 (which is a replica of an OTA that this circuit is being used to control), resistors 504, 506, and 508, capacitors 510, 512, and 514, and XNOR gate 516. Schmitt-trigger oscillator 500 oscillates at a frequency given by $f_0=1/(2RC)\cdot 1/\ln((1+\beta)/(1-\beta))$, where $\beta=V_{hyst}/V_{HL}$, and where $V_{hyst}$ may be the difference between the trigger voltages for the rising and falling cases, and where $V_{HL}$ is the difference between the high and low outputs. The onset of oscillation may be detected in Schmitt-trigger oscillator 500 through an XNOR gate 516.

XNOR gate 516 has an output that decreases when oscillations are present. Therefore, if the oscillator amplitude increases, $V_{NR}$ is reduced, and, when the oscillator amplitude decreases, $V_{NR}$ is increased. In practice, because the determined $V_{NR}$ may cause oscillations in Schmitt-trigger oscillator 500 that are too fast for XNOR gate 516 to respond, a feedback loop 518 may be used to keep these unintended oscillations down. The resulting $V_{NR}$ may be reduced through a gain less than, but close to, one, and applied to an OTA to keep the small-signal gain positive in the OTA.

Figure 3B:
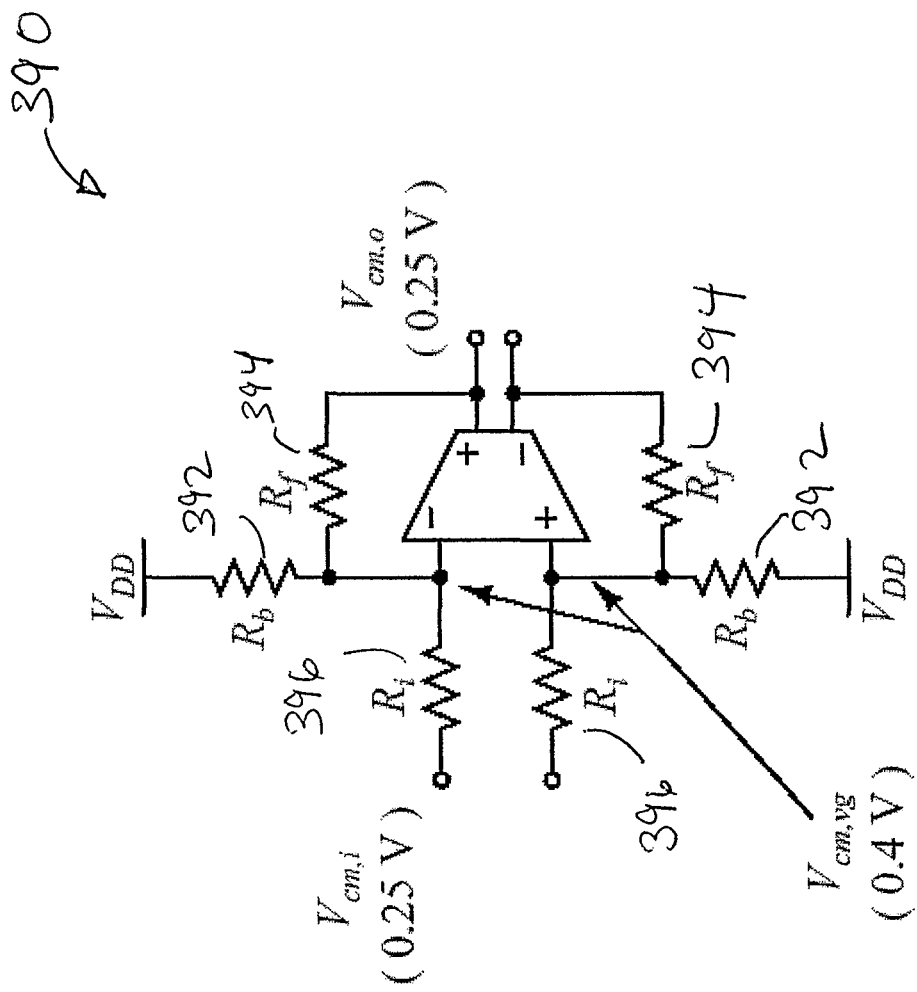
FIG. 3B is schematic diagram of an OTA configured with resistors for controlling the common mode voltages associated with the OTA in accordance with certain embodiments of the present invention.

FIG. 3B illustrates a circuit 390 including the OTA 300 described above in connection with FIG. 3A along with resistors $R_b$ 392, $R_f$ 394 and $R_i$ 396. As shown, resistors 392 may be used without affecting the overall gain of operational transconductance amplifier (OTA) 300, if $R_f << A\cdot(R_i\|R_f\|R_b)$ where $R_i$ is the value of resistors 396, $R_f$ is the value of resistors 394, $R_b$ is the value of resistors 392, and A is the open-loop DC gain of the amplifier. For example, if $V_{DD}$ is 0.5 Volts and the input and output of OTA 300 are 0.25 Volts, to push $V_{cm,vg}$ to 0.4 Volts, $R_b = 2/3\cdot(R_1\|R_2)$. The output common-mode level, $V_{cm,o}$, may be set to $V_{DD}/2$ so the output voltage signal may swing about the same magnitude in either direction. In certain embodiments, where more than one stage is used in the circuit design, the $V_{cm,o}$ of the previous stage, may drive the input of the next stage. Resistors 392 can also be replaced by current sources implemented with transistors—see, e.g., K. Bult, "Analog Design In Deep Sub-Micron CMOS," Proceedings European Solid-State Circuits Conference (ESSCIRC), September 2000, pp. 11-17, and S. Karthikeyan, S. Mortezapour, A. Tammineedi, and E. Lee, "Low Voltage Analog Circuit Design Based On Biased Inverting Opamp Configuration," IEEE Trans. Circuits Syst. II, vol. 47, no. 3, pp. 176-184, March 2000, which are hereby incorporated by reference herein in their entireties.

Figure 6:
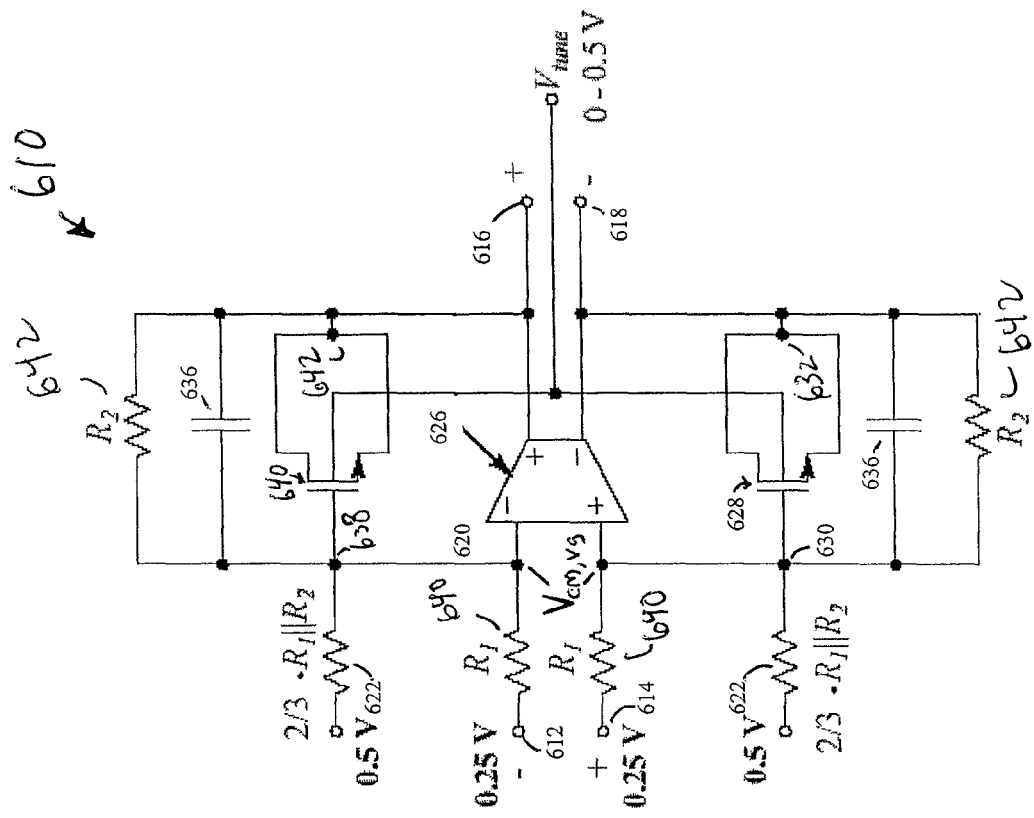
FIG. 6 is a schematic diagram of a low-voltage damped tunable integrator in accordance with certain embodiments of the present invention.

FIG. 6 illustrates a low-voltage tunable damped integrator 610 in accordance with certain embodiments of the present invention. As shown, integrator 610 includes an OTA 626, which may be identical to the first stage of the OTA described above in connection with FIG. 3A. In order to turn on the gate-input devices of OTA 626 when the CM voltages of integrator 610 inputs ($V_{in}^-$ 612 and $V_{in}^+$ 614) and outputs ($V_{out}^+$ 616 and $V_{out}^-$ 618) are both $V_{DD}/2$ (i.e., 0.25 Volts), a common level virtual ground $V_{cm,vg}$ across the inputs of OTA 626 may be manipulated. Such a common level virtual ground may be maintained by supply resistors 622 to $V_{DD}$ (i.e., 0.5 Volts) at the inputs of OTA 626. Supply resistors 622 may be used without affecting the overall gain of integrator 610, if $R_2 << A\cdot(R_1\|R_2\|R_b)$ as mentioned above in connection with FIG. 1B. The output common-mode level, $V_{cm,o}$, may be set to $V_{DD}/2$ so the output voltage signal may swing about the same magnitude in either direction. In certain embodiments, where more than one stage is used in the circuit design, the $V_{cm,o}$ of the previous stage, may drive the input of the next stage.

The tuning capacitors may be able to compensate for possible manufacturing variations in the transistors within integrator 610. As shown, transistors 628 and 640 may be used as tunable capacitances between gate node 630 and source/drain node 632 and gate node 638 and source/drain node 642, respectively. Gate nodes 630 and 638 are at 0.4 Volts and source/drain nodes 632 and 642 are at 0.25 Volts with the capacitance being tuned through the body voltage of transistors 628 and 640 (i.e., $V_{tunep}$). Fixed shunt capacitors, $C_{fixed}$ 636, across OTA 626 may reduce the voltage dependence and improve the density of integrator 610. For example, if $C_{fixed}$ 636 is a 1 pF capacitor, the tuning range of transistors 628 and 640 may be from 0.8 pF to 1.2 pF for a tune voltage from 0 to 0.5 Volts.

Figure 7:
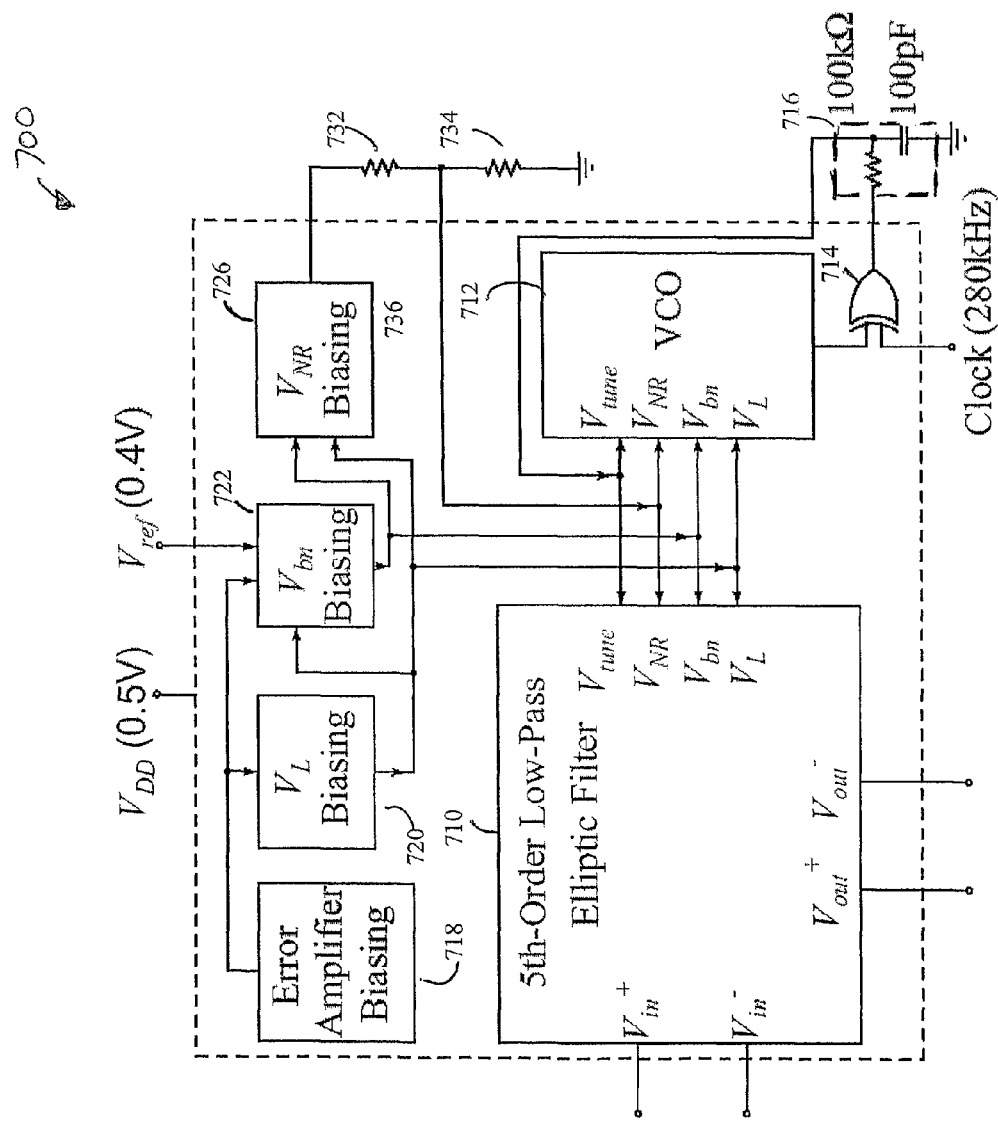
FIG. 7 is a block diagram of a filter in accordance with certain embodiments of the present invention.

FIG. 7 illustrates, on a block diagram level, how an integrated fifth-order, low-pass, elliptic filter 700 may implemented in accordance with certain embodiments of the invention. As shown integrated filter 700 may include elliptic filter 710, voltage controlled oscillator 712, XOR gate 714, filter 716, biasing circuitry 718, 720, 722, and 726, and resistors 732 and 734.

Fifth-order low-pass filter 700 may be constructed using a combination of the techniques discussed earlier, for example, using tunable capacitors, low-voltage OTAs, and a multiple stage amplifier design. Low-pass filter 710 may be implemented as described below in connection with FIG. 8A. Voltage-controlled oscillator 712 may be implemented as described below in connection with FIG. 8B. A phase lock loop (PLL) including VCO 712, an XOR gate 714, and an external loop filter 716 is used to tune filter 710, thereby changing the operating characteristics. XOR gate 714 is used as a phase detector by comparing the output of VCO 712 with the output of another clock. The output of XOR 714 may be filtered by external loop filter 716. Error amplifier biasing circuitry 718 may be used to generate $V_{amp}$ for $V_L$ biasing circuitry 720 and $V_{bn}$ circuitry 722, which all may be constructed as set forth above in connection with FIG. 4. The $V_L$ biasing circuitry may generate a level shifting voltage $V_L$ that is used by the OTAs in $V_{bn}$ circuitry 722 and $V_{NR}$ circuitry 726, which may be constructed as set forth above in connection with FIG. 4 and FIG. 5B, respectively. As shown, $V_{bn}$ circuitry 722 may use a $V_{ref}$ of 0.4 Volts and generate a $V_{bn}$ used to forward bias certain transistors in the low-voltage circuit as described above. $V_{NR}$ circuitry 726 may use $V_{bn}$, $V_L$, $R_1$ 732, and $R_2$ 734 to generate $V_{NR}$ as shown in FIGS. 3 and 5B.

Figure 8A:
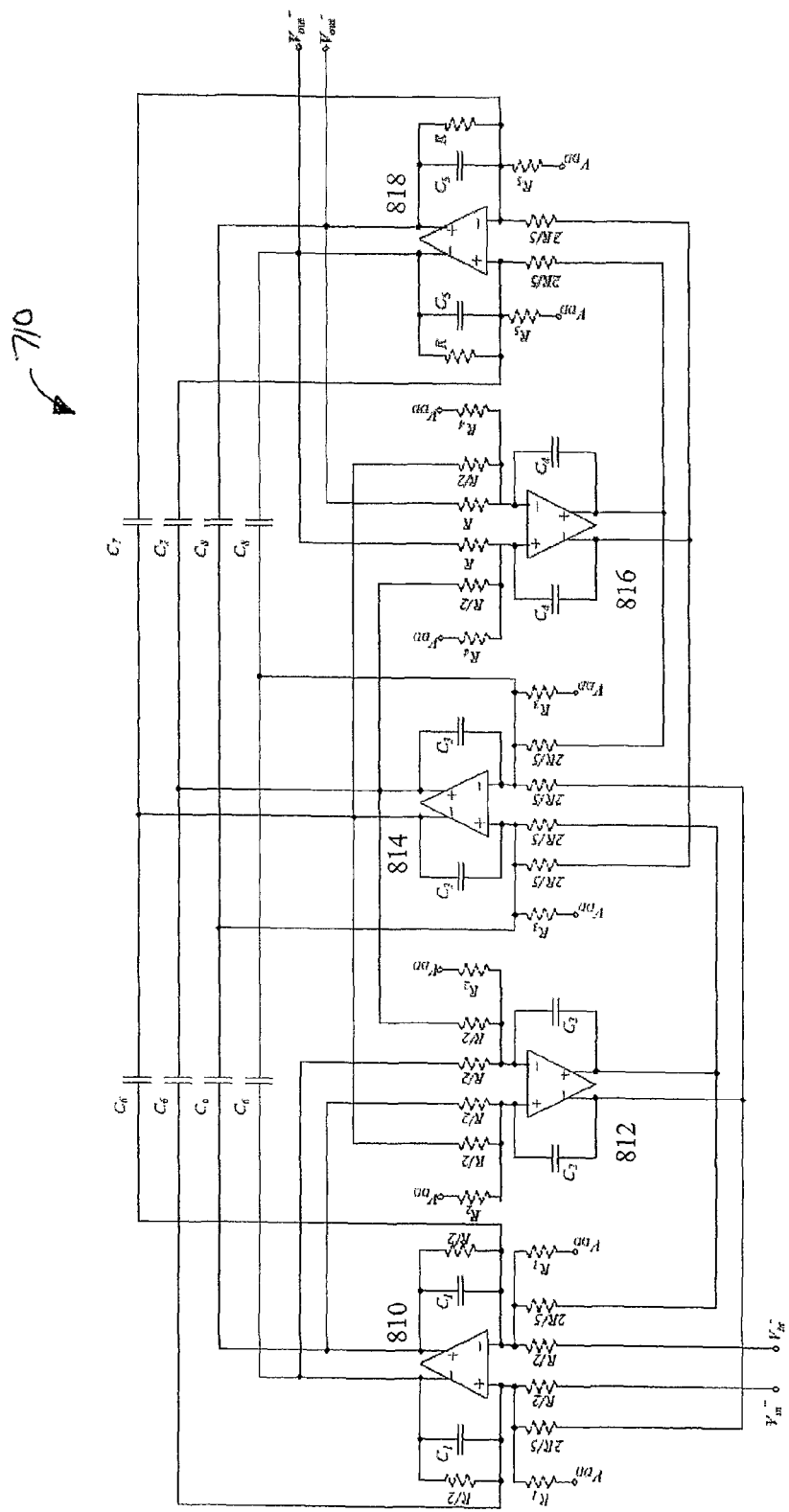
FIG. 8A is a schematic diagram of a filter in accordance with certain embodiments of the present invention.

FIG. 8A illustrates low-voltage fifth order low-pass elliptic filter 710 in accordance with certain embodiments of the present invention. As shown, filter 710 is composed of five OTAs 810, 812, 814, 816, and 818. These OTAs may be substantially identical to the OTA illustrated in connection with FIG. 3A. Each OTA may additionally use $V_{tune}$, $V_{neg}$, $V_{bn}$, and $V_L$ (not shown in FIG. 8A) as provided by supporting circuitry shown in FIG. 7 and discussed in connection with FIGS. 3, 4 and 5B. Filter 710 is designed with multiple resistors and capacitors as known in the art to achieve the desired operational characteristics.

An example of some values for transistor sizes and other components for the circuit 710 of FIG. 8A can be found below:

| Resistors | Value (kΩ) | Capacitors | Value (pF) |
|---|---|---|---|
| R | 300 | C1 | 9.2 |
| R1 | 30 | C2 | 13.1 |
| R2 | 50 | C3 | 20.2 |
| R3 | 40 | C4 | 8.8 |
| R4 | 66.7 | C5 | 5.3 |
| R5 | 57.2 | C6 | 1.8 |
|  |  | C7 | 5.7 |
|  |  | C8 | 2.9 |

Figure 8B:
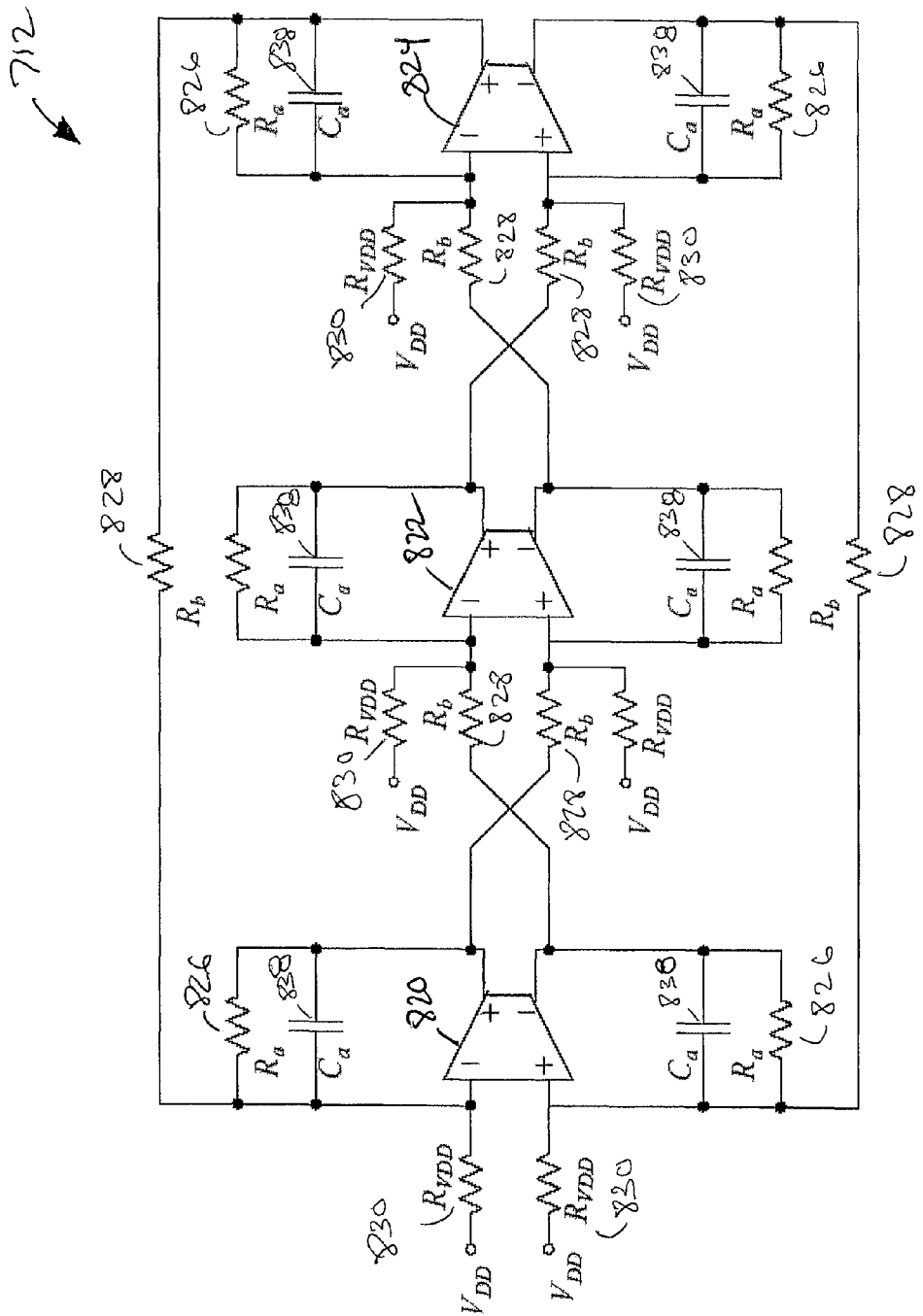
FIG. 8B is a schematic diagram of a voltage controlled oscillator in accordance with certain embodiments of the present invention.

FIG. 8B illustrates an embodiment of a low-voltage, voltage-controlled oscillator (VCO) 712 in accordance with certain embodiments of the present invention. As shown, VCO 712 may be constructed using tunable integrators formed from OTAs 820, 822, and 824 (as described herein) and resistors $R_a$ 826, $R_b$ 828, $R_{VDD}$ 830, and capacitors $C_a$ 838 matched to those in the filter with which the VCO is being used (e.g., the filter described above in connection with FIG. 8A). The oscillator frequency, $f_0$, is chosen to be close to the second zero of the filter, 280 kHz. The OTAs have enough gain-bandwidth to set a phase lag of 60 degrees per stage along with the required gain of greater than 1, at $f_0$, to reliably sustain oscillations. The oscillator has a nominal frequency of oscillation given by:

$$f_0 = \frac{\sqrt{3}}{2\pi R_a C_a}$$

and oscillations are possible only when $R_a \geq 2R_b$. For example, the following values may be used in certain embodiments of the invention: $R_a$=427 kΩ; $R_b$=207 kΩ; $R_{VDD}$=93 kΩ; and Ca=2.3 pF.

Figure 9:
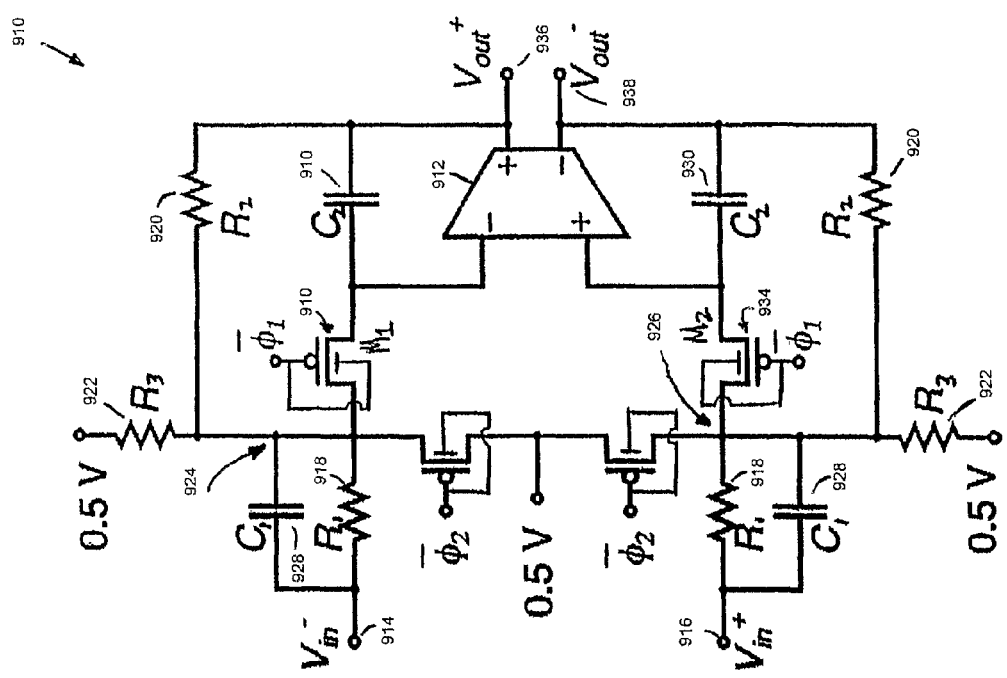
FIG. 9 is a schematic diagram of a track and hold circuit in accordance with certain embodiments of the present invention.

FIG. 9 is an illustration of a track-and-hold circuit 910 implemented using an Operational Transconductance Amplifier (OTA) 912 in accordance with certain embodiments of the present invention. OTA 912 may be implemented using the OTA described above in connection with FIG. 3A. As previously described herein, OTA 912 may be designed to have a high gain for an input common-mode voltage of 0.4 Volts and an output common-mode voltage of 0.25 Volts. At terminals $V_{in}^-$ 914 and $V_{in}^+$ 916, the common-mode is 0.25 Volts. $R_1$ 918, $R_2$ 920, and $R_3$ 922 may be sized so as to provide a bias voltage of 0.4 Volts at node 924 and node 926 for some embodiments of this circuit. Selections of these resistors are described above in connection with FIG. 1B. Other bias voltages may be used in different implementations of this circuit. In order to implement the circuit with unity gain, $R_1$ 918 and $R_2$ 920 may be equally sized. Alternatively, $R_1$ 918 and $R_2$ 920 can be sized differently to provide non-unity gain in the circuit. Thus, for example, $R_1$ 918 and $R_2$ 920 may be equally sized, and $R_3$ 922 may be one-third the size of $R_1$ 918 and $R_2$ 920 in the circuit illustrated.

Capacitor $C_1$ 928 may be sized such that capacitors $C_1$ 928 and $C_2$ 930 and resistors $R_1$ 918 and $R_2$ 920, maintain the relation $R_1C_1 = R_2C_2$. This relation allows a pole introduced by $R_2$ 920 and $C_2$ 930 to be cancelled by a zero introduced by $R_1$ 918 and $C_1$ 928. $C_2$ 930 may be sized as large as possible given the size of the OTA 912 and the speed and noise requirements of circuit 910.

Although specific examples of component requirements are set forth above, these requirements may be altered to implement different embodiments of this circuit. For example, with a different embodiment of OTA 912, other voltage levels may be appropriate. As with previously mentioned embodiments of OTAs, OTA 912 may use tuning and biasing circuitry as shown in FIG. 4.

In operation, circuit 910 may track a voltage presented at inputs 914 and 916 or hold a voltage for a time. When $M_1$ 932 is closed and $M_2$ 934 is open, the circuit may track at terminals $V_{out}^-$ 936 and $V_{out}^+$ 938 the voltages at terminals $V_{in}^-$ 914 and $V_{in}^+$ 916. When $M_2$ 934 is closed and $M_1$ 932 is open, the circuit may hold the last voltage tracked at terminals $V_{in}^-$ 914 and $V_{in}^+$ 916. $M_1$ 932 and $M_2$ 934 should not be closed at the same time. Transistors $M_1$ 932, $M_2$ 934, 940, and 942 may have a gate to body coupling to lower the voltage threshold and to operate the gates closer to moderate inversion. In some embodiments, sample-and-hold architecture 910 may be extended to develop a pipelined Analog to Digital Converter (ADC) and Digital to Analog Converter (DAC) or may be the first stage in a switched-operational amplifier realization of a switched-capacitor circuit.

Figure 10:
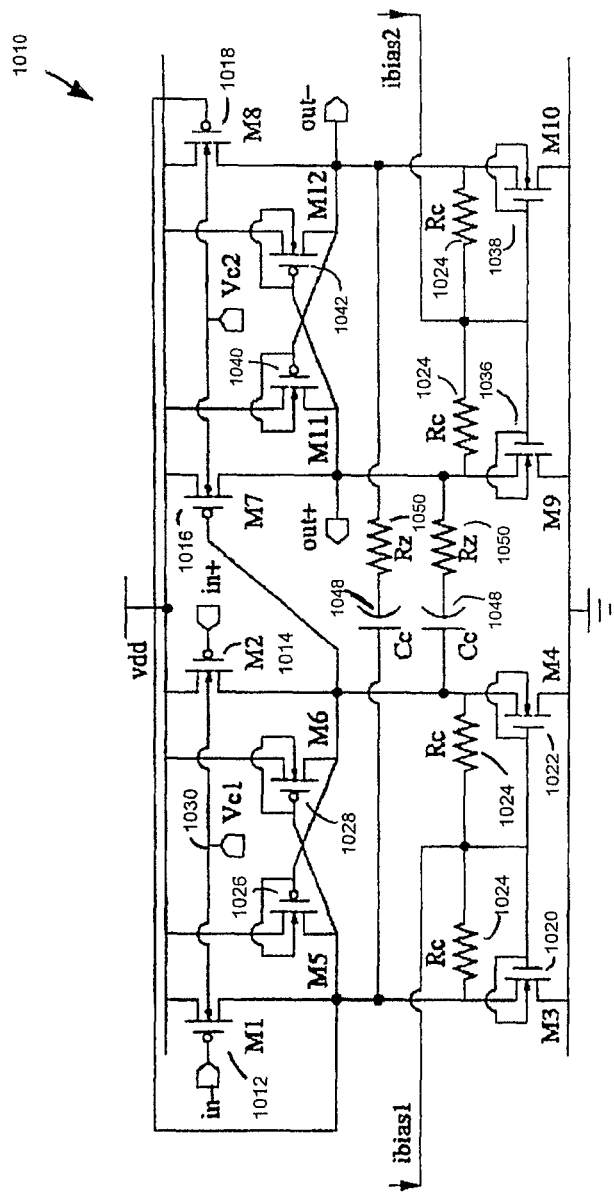
FIG. 10 is a schematic diagram of another gate-input OTA in accordance with certain embodiments of the present invention.

FIG. 10 illustrates a gate-input operational transconductance amplifier 1010 with intrinsic common-mode rejection. The first stage of OTA 1010 uses PMOS input transistors $M_1$ 1012 and $M_2$ 1014 that form a differential pair and that operate with a DC common-mode input of 0.1 Volts. The signal common-mode (not shown) is $V_{DD}/2$ (i.e., 0.25 Volts). The difference between the signal common-mode and the DC common-mode input (i.e., the virtual ground) is maintained by the resistor technique shown in FIG. 1B where OTA 100 is replaced by OTA 1010. As illustrated, level-shifting and common-mode biasing techniques are used similarly to that described above. The output common-mode of OTA 1010 is set to 0.1 Volts to ensure proper biasing of the outputs connected to transistors $M_7$ 1016 and $M_8$ 1018. Transistors $M_3$ 1020 and M$_4$ 1022 form active loads that act as current source loads for the differential-mode signal. Resistors Rc 1024 detect the output common-mode voltage of the stage and feed it back to the gates of transistors M$_3$ 1020 and M$_4$ 1022 so that transistors M$_3$ 1020 and M$_4$ 1022 are diode connected for common-mode signals. The cross-coupled transistors M$_5$ 1026 and M$_6$ 1028 act as differential negative resistance loads to improve the DC gain. For common-mode signals, transistors M$_5$ 1026 and M$_6$ 1028 are diode connected. A bias voltage Vc1 1030 to the bodies of input transistors M$_1$ 1012 and M$_2$ 1014 is used to control the DC output common-mode level as discussed above in connection with the OTA of FIG. 3A.

As shown, transistors M$_3$ 1020, M$_4$ 1022, M$_5$ 1026, and M$_6$ 1028 are body-gate coupled so that the body transconductances of the transistors add to their gate transconductances. The resulting forward bias on the source-body junction reduces the voltage threshold and raises the inversion level of the device to being close to moderate inversion.

The DC current ibias1 may be generated in a similar manner to that shown in FIG. 4 for V$_L$. As illustrated, ibias1 is used to create a voltage shift across resistors Rc 1024 to bias the gate of M$_3$ 1020 and M$_4$ 1022.

The DC gains in differential-mode, A$_{diff}$, and in common-mode, A$_{cm}$, for one stage may be given by:

$$A_{diff} = \frac{g_{m1}}{[g_{ds1} + g_{ds3} + g_{ds5} + 1/R_1 - (g_{m5} + g_{mb5})]}$$

$$A_{cm} = \frac{g_{m1}}{[g_{m3} + g_{mb3} + g_{m5} + g_{mb5} + g_{ds1} + g_{ds3} + g_{ds5}]}$$

where g$_{mi}$, g$_{mbi}$, and g$_{dsi}$ denote the transconductance, body transconductance and output conductance of device M$_i$ respectively. Transconductance g$_{m3}$ is usually larger than transconductance g$_{m1}$ by a factor close to the electron hole mobility ratio, typically about two to three, when M$_3$ 1020 and M$_4$ 1022 operate at the about the same current level as M$_1$ 1012 and M$_2$ 1014. The common-mode gain, A$_{cm}$, which is typically intrinsically smaller than one, is reduced due to loading by the output conductances and transconductances of M$_5$ 1026 and M$_6$ 1028.

The negative differential conductance in M$_5$ 1026 and M$_6$ 1028 may be conservatively sized such that it cancels out 60 percent of the output conductance and provides a DC gain boost around 8 dB. Alternatively, the body terminals of M$_5$ 1026 and M$_6$ 1028 can be connected to a body voltage, V$_{NR}$, as described above in connection with transistors M$_{4A}$ 340 and M$_{4B}$ 342 of FIG. 3A and as described in FIGS. 5A and 5B.

As shown in FIG. 10, stage two of OTA 1010 has a similar topology to that the first stage. In fact, transistors M$_9$ 1036, M$_{10}$ 1038, M$_{11}$ 1040, and M$_{12}$ 1042 operate in a similar manner to transistors M3 1020, M4 1022, M5 1026, and M6 1028. Some differences between the two stages may include the output common-mode voltage and the biasing chosen for Vc2 1044 and ibias2 1046. For example, stage two biasing may be different than stage one biasing when certain operational characteristics are desired. In between the two stages, Miller compensation may be used. Series resistors Rz 1050 for the capacitors Cc 1048 may further be used to move the zero due to Cc 1048 to improve the phase margin and stability.

An example of some values for transistor sizes and other components for the circuit of FIG. 10 can be found below:

| First Stage | | | Second stage | | |
|---|---|---|---|---|---|
| Transistors | W (μm) | L (nm) | Transistors | W (μm) | L (nm) |
| M1 | 388 | 500 | M1 | 388 | 500 |
| M2 | 388 | 500 | M2 | 388 | 500 |
| M3 | 388 | 500 | M3 | 388 | 500 |
| M4 | 388 | 500 | M4 | 388 | 500 |
| M5 | 12 | 500 | M5 | 240 | 500 |
| M6 | 12 | 500 | M6 | 240 | 500 |

| Resistors and Capacitors | | Currents | |
|---|---|---|---|
| Rc | 33 kΩ | ibais1 | 12.75 uA |
| Rz | 4 kΩ | ibais2 | 3 uA |
| Cc | 3.1 pF | | |

Figure 11A:
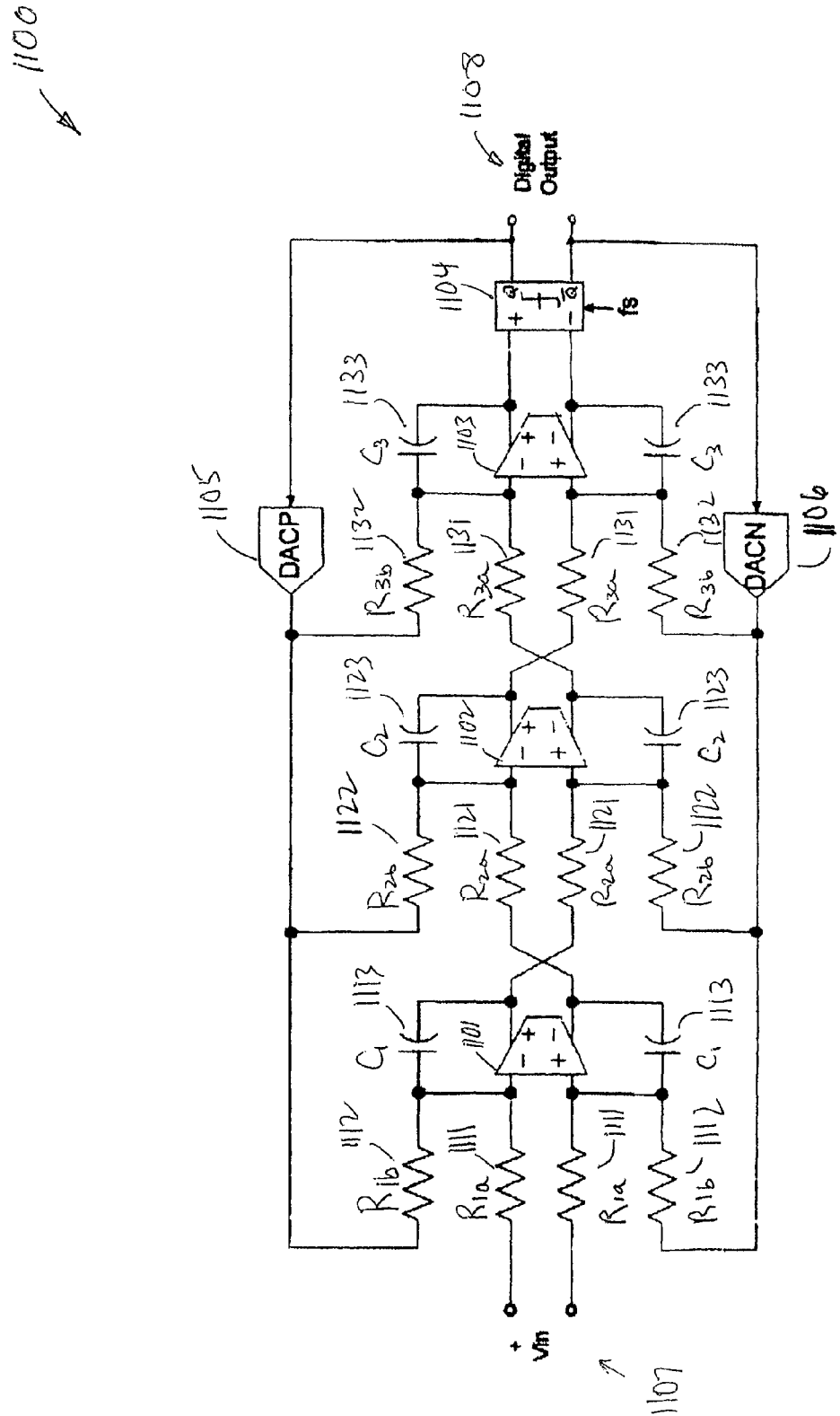
FIGS. 11A and 11B are schematic diagrams of a continuous-time sigma delta modulator in accordance with certain embodiments of the present invention.
Figure 11B:
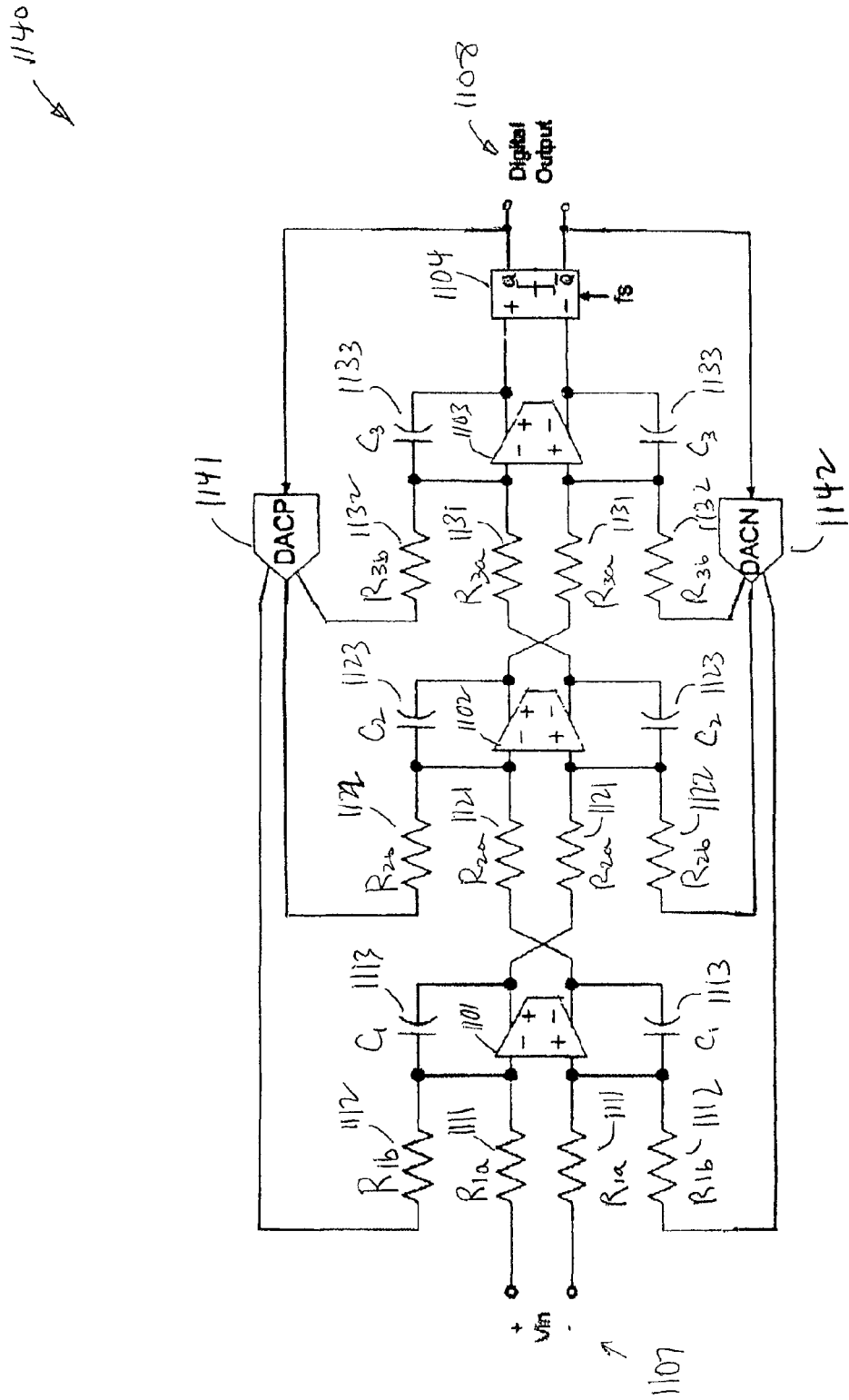

FIGS. 11A and 11B illustrate third-order, continuous-time sigma-delta (ΣΔ) modulators 1110 and 1140 in accordance with certain embodiments of the present invention. ΣΔ modulators 1110 and 1140 are implemented in a fully differential form with active RC integrators.

As shown, modulator 1110 includes OTAs 1101, 1102, 1103, clocked comparator 1104, digital-to-analog converters (DACs) 1105, resistors 1111, 1112, 1121, 1122, 1131, and 1132, and capacitors 1113, 1123, and 1133. Modulator 1140 includes OTAs 1101, 1102, 1103, clocked comparator 1104, digital-to-analog converters (DACs) 1141, resistors 1111, 1112, 1121, 1122, 1131, and 1132, and capacitors 1113, 1123, and 1133.

OTAs 1101, 1102, and 1103 may be implemented using a body-input, two-stage OTA with Miller compensation. Such an OTA is illustrated, for example, in connection with FIG. 2A above. OTAs 1101, 1102, and 1103 may additionally or alternatively be implemented using any other suitable OTAs, such as those described in connection with FIGS. 1 and 3A.

The ratios of the resistors coupled to each amplifier (e.g., R$_{1a}$ 1111/R$_{1b}$ 1112 for error amplifier 1101) represent the modulator coefficients. The modulator coefficients may be obtained from a discrete-time prototype modulator through an impulse-invariant transformation with the feedback DAC waveform being taken into account, for example as described in James A. Cherry and W. Martin Snelgrove, "Excess Loop Delay in Continuous-Time Delta-Sigma Modulators", EEE Transactions On Circuits And Systems—II: Analog And Digital Signal Processing, vol. 46, no. 4, pp.376-389, April 1999, which is hereby incorporated by reference herein in its entirety.

In some embodiments, the component values shown in the following table may be used. These component values have been selected for a signal bandwidth of 25 KHz, which is suitable for audio applications. Preferably, high-resistivity polysilicon layer resistors and metal-insulator-metal (MIM) capacitors are used. Obviously, other values and types of resistors and capacitors could be used in accordance with the invention.

| Component | Value |
|---|---|
| R$_{1a}$ | 275 kΩ |
| R$_{1b}$ | 86 kΩ |
| R$_{2a}$ | 88 kΩ |
| R$_{2b}$ | 145 kΩ |
| R$_{3a}$ | 66 kΩ |
| R$_{3b}$ | 93 kΩ |
| C$_1$ | 31.25 pF |
| C$_2$ | 7.8 pF |
| C$_3$ | 5.2 pf |

In some embodiments of the present invention, pulse shaping and time delay are used to modify performance of σΔ modulators 1110 and 1140. Return-to-zero pulse shaping (i.e., the output of DACs 1105 and 1141 in the modulators are cleared after certain clock cycles) is used to avoid inter-symbol-interference (or the memory effect) that can exist in continuous-time ΣΔ modulators. A ten percent time delay (or any other suitable delay) on the DAC waveforms may be used to minimize the effect of parasitic loop delays and to allow the comparator outputs to fully settle.

More particularly, a return-to-open technique may be used to implement return-to-zero pulse shaping in accordance with the present invention. This technique leaves the outputs of the DACs floating (or open-circuited). Because the DAC outputs are open-circuited, current will not flow to the integrating capacitors $C_1$ 1113, $C_2$ 1123, and $C_3$ 1133 from the DACs. Rather, during the floating intervals, the DAC output voltages are pulled either down or up, through the resistors to the amplifier's input level, which is set in some embodiments to $V_{DD}/2$.

Figure 12A:
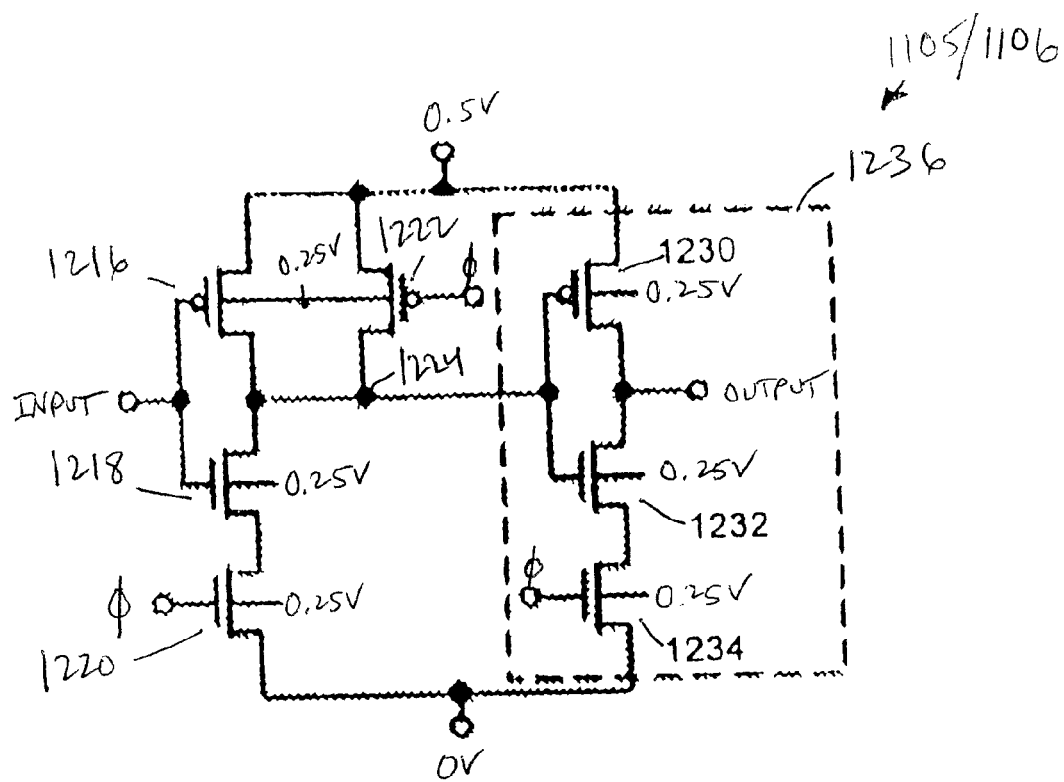
FIGS. 12A and 12B are schematic diagrams of digital-to-analog converters (DACs) in accordance with certain embodiments of the present invention.
Figure 12B:
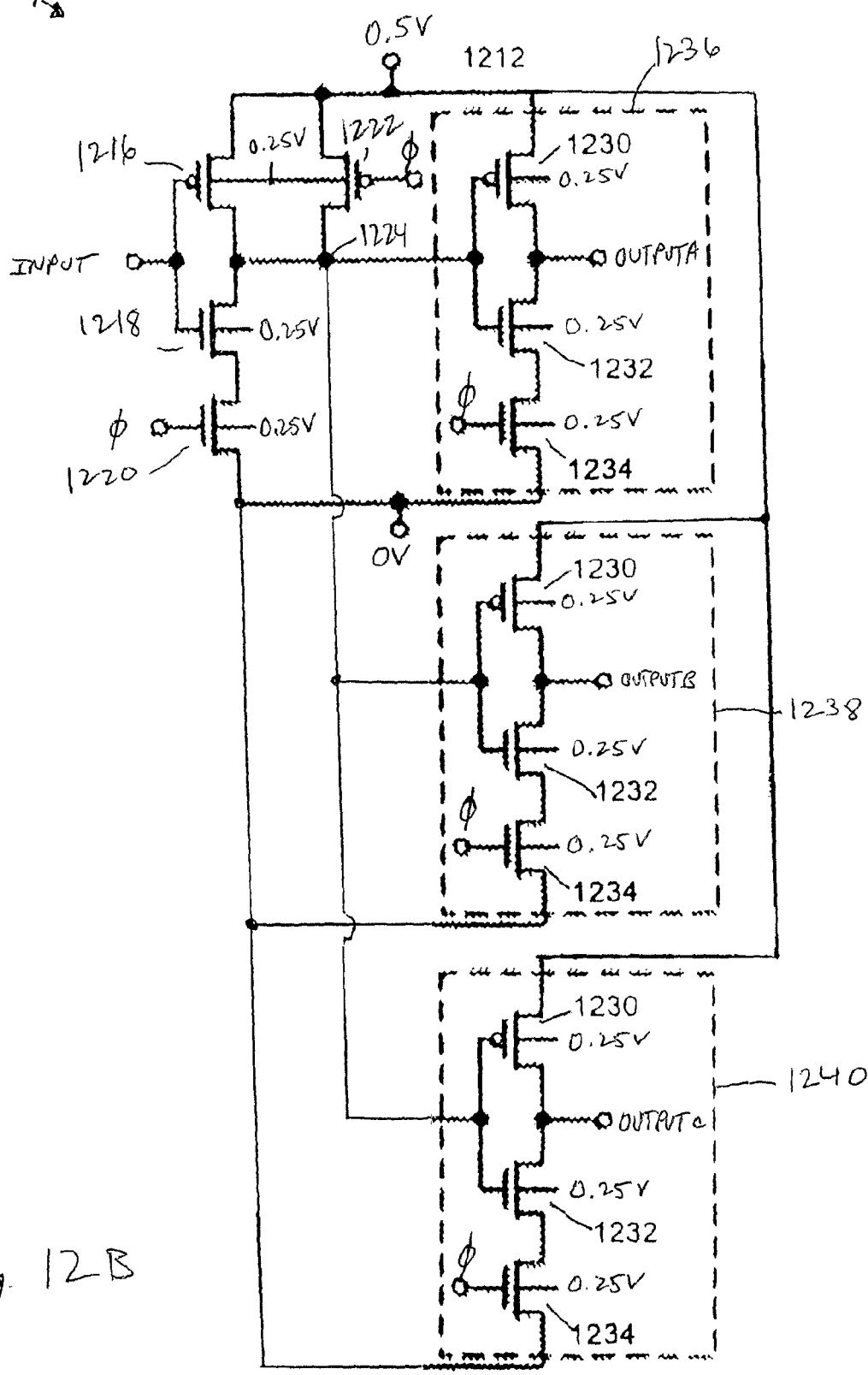

FIGS. 12A and 12B illustrate DACPs 1105 and 1106 and DACNs 1141 and 1142, respectively, which implement the return-to-open technique, in accordance with certain embodiments of the present invention. As shown, these DACs include transistors 1216, 1218, 1220, 1222, 1230, 1232, and 1234. The body terminals of these transistors are biased at 0.25 Volts. The reference voltages (i.e., the positive and negative rails) are 0.5 Volts and 0 Volts. In other embodiments, different biasing and reference voltages may be appropriate for operation of the circuits.

The operation of the DACs is described as follows. A clock input φ is provided to the gates of transistors 1220, 1222, and 1234. Transistors 1216, 1218, and 1220 form a tri-state buffer. When the clock φ is low transistor 1220 turns off, and node 1224 is reset to 0.5 Volts by transistor 1222. When the clock φ is high, node 1224 may be coupled to 0.5 Volts or 0 Volts depending on the value of the input and the corresponding states of transistors 1216 and 1218.

As shown in FIG. 12A, the signal at node 1224 is buffered by buffer stage 1236. Thus, when clock φ is low, transistor 1234 turns off and causes the output to float. When clock φ is high, the output buffers the signal at node 1224.

As shown in FIG. 12B, in some embodiments, a split-buffering technique may be used with ΣΔ modulators to avoid inter-stage signal coupling. In modulator 1100, when one buffer is used, the internal signals of the integrators may couple at the outputs of the DACs and thereby degrade the performance of the modulator. With a split-buffer approach, buffers 1236, 1238, and 1240 of FIG. 12B are used to separate each integrator and to avoid coupling, as shown in FIG. 11B.

Although FIGS. 11B and 12B illustrate DACs with multiple outputs, multiple DACs each with a single output that are connected to the same comparator may also be used to implement this aspect of the present invention. Also, although the DACs in FIGS. 12A and 12B are illustrated as incorporating circuitry for creating a high impedance between (i) the DACs and (ii) the capacitors and OTAs as illustrated herein, this high impedance could be created by any suitable circuitry between these points.

In some embodiments, a low jitter external clock may be used and an internal circuit may generate different phases of the clock if the continuous-time modulator is sensitive to clock jitter in the return-to-open circuit.

Figure 13:
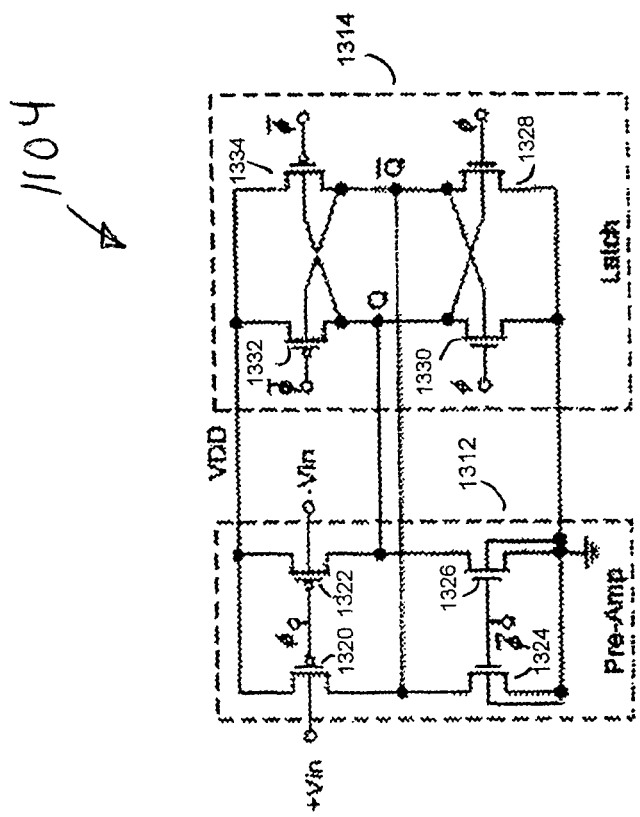
FIG. 13 is a schematic diagram of a comparator in accordance with certain embodiments of the present invention.

Comparator 1104 in continuous-time ΣΔ modulators 1110 and 1140 serves two purposes, sampling and comparison, and may be a clocked or a latched comparator. FIG. 13 illustrates one embodiment of a comparator 1104 that may be used in accordance with certain embodiments of the present invention. As shown, comparator 1104 consists of two stages, namely pre-amplifier 1312 and latch 1314. Both stages use the body terminals as inputs. In certain embodiments, because the bodies of both PMOS and NMOS transistors are used to pass signals in both stages, a CMOS process with both n-well and p-well, or a triple-well option, may be used.

As illustrated, pre-amplifier 1312 includes clock signal φ, inverse clock signal $\bar{\phi}$, and transistors 1320, 1322, 1324, and 1326. The gates of transistors 1320 and 1322 are coupled to clock signal φ, while the gates of transistors 1324 and 1326 are coupled to inverse clock signal $\bar{\phi}$. As shown, transistors 1320 and 1322 form a differential pair and transistors 1324 and 1326 form an active load. In operation when clock φ is low, transistors 1320 and 1322 turn on and amplify the input. The amplified signal may then be stored in the parasitic capacitors at the output nodes. When clock φ is high, transistors 1320 and 1322 turn off and transistors 1324 and 1326 turn on. Transistors 1324 and 1326 have their body terminal connected to ground.

Latch 1314 includes clock signal φ, inverse clock signal $\bar{\phi}$, transistors 1328 and 1330 (which form a cross-coupled pair), and transistors 1332 and 1334 (which form a cross-coupled pair). When clock φ is high, cross-coupled transistors 1328 and 1330 turn on and the input signal is latched. When clock φ is low, transistors 1328 and 1330 turn off and transistors 1332 and 1334 turn on, which allows for a new input signal to be latched. Latch 1314 may be a regenerative circuit whose speed is proportional to the Gm of the transistors used in latch 1314 and a load capacitor (not shown).

Other embodiments, extensions, and modifications of the ideas presented above are comprehended and within the reach of one versed in the art upon reviewing the present disclosure. Accordingly, the scope of the present invention in its various aspects should not be limited by the examples and embodiments presented above. The individual aspects of the present invention, and the entirety of the invention should be regarded so as to allow for such design modifications and future developments within the scope of the present disclosure. The present invention is limited only by the claims that follow.

What is claimed is:

1. A track and hold circuit having an input and an output that operates using a non-zero, substantially constant supply voltage with respect to a ground level, comprising:
  an operational transconductance amplifier (OTA) coupled to the ground level and having an input and an output, wherein the output is coupled to the output of the track and hold circuit;
  a capacitor that is coupled across the input and the output of the OTA;
  a first switch having an input and an output, wherein the output is coupled to the input of the OTA;
  a second switch having an input and an output, wherein the input is coupled to the non-zero, substantially constant supply voltage and the output is coupled to the input of the first switch; and
  a resistor having a first side and a second side, wherein the first side is coupled to the non-zero, substantially constant supply voltage and the second side is coupled to the input of the first switch, and wherein the resistor has a substantially constant resistance.

2. The track and hold circuit of claim 1, further comprising a second resistor wherein the resistor is coupled between the input of the track and hold circuit and the input of the first switch.

3. The track and hold circuit of claim 2, further comprising a capacitor coupled in parallel to the second resistor.

4. The track and hold circuit of claim 1, further comprising a resistor coupled between the input of the first switch and the output of the OTA.

5. The track and hold circuit of claim 1, wherein the circuit is implemented as an integrated circuit.

6. The track and hold circuit of claim 1, wherein the OTA is a fully differential operational transconductance amplifier.

7. The track and hold circuit of claim 1, wherein the supply voltage is less than one volt.

8. The track and hold circuit of claim 7, wherein the supply voltage is a half volt.

9. The track and hold circuit of claim 1, wherein the OTA comprises:
an active load;
a differential pair of transistors having a first transistor and a second transistor, each of the first transistor and the second transistor having a source, having a gate coupled to the first input of the OTA, having a body coupled to a bias voltage, and having a drain coupled to the first output of the OTA and the active load; and a level shift bias circuit that creates a common mode feedback and that is coupled to the drain of the first transistor, the drain of the second transistor, and the active load.

10. A track and hold circuit having an input and an output that operates using a non-zero, substantially constant supply voltage with respect to a ground level, comprising:
an OTA means for providing an operational transconductance amplifier (OTA) coupled to the ground level and having an input and an output, wherein the output is coupled to the output of the track and hold circuit:
a means for providing a capacitance that is coupled across the input and the output of the OTA means;
a first switching means for switching having an input and an output, wherein the output is coupled to the input of the OTA means;
a second switching means for switching having an input and an output, wherein the input is coupled to the non-zero, substantially constant supply voltage and the output is coupled to the input of the first switching means; and
a means for providing a resistance having a first side and a second side, wherein the first side is coupled to the non-zero, substantially constant supply voltage and the second side is coupled to the input of the first switching means, and wherein the means for providing resistance has a substantially constant resistance.

11. The track and hold circuit of claim 10, further comprising a second means for providing a resistance wherein the second means is coupled between the input of the track and hold circuit and the input of the first switching means.

12. The track and hold circuit of claim 11, further comprising a second means for providing a capacitance coupled in parallel to the second means for providing a resistance.

13. The track and hold circuit of claim 10, further comprising a second means for providing a resistance coupled between the input of the first switching means and the output of the OTA.

14. The track and hold circuit of claim 10, wherein the circuit is implemented as an integrated circuit.

15. The track and hold circuit of claim 10, wherein the OTA means is fully differential.

16. The track and hold circuit of claim 10, wherein the supply voltage is less than one volt.

17. The track and hold circuit of claim 16, wherein the supply voltage is a half volt.

* * * * *